(12) United States Patent
Kim et al.

(10) Patent No.: US 11,264,482 B2
(45) Date of Patent: Mar. 1, 2022

(54) SEMICONDUCTOR DEVICE INCLUDING DUMMY GATE PATTERNS AND MANUFACTURING METHOD THEREOF

(71) Applicant: Samsung Electronics Co., Ltd., Suwon-si (KR)

(72) Inventors: Donghyun Kim, Hwaseong-si (KR); Inhyun Song, Suwon-si (KR); Yeongmin Jeon, Hwaseong-si (KR); Sejin Park, Seoul (KR); Juyun Park, Seongnam-si (KR); Jonghoon Baek, Ansan-si (KR); Taeyeon Shin, Hwaseong-si (KR); Sooyeon Jeong, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 64 days.

(21) Appl. No.: 16/572,681

(22) Filed: Sep. 17, 2019

(65) Prior Publication Data

US 2020/0343364 A1 Oct. 29, 2020

(30) Foreign Application Priority Data

Apr. 23, 2019 (KR) .......................... 10-2019-0047578

(51) Int. Cl.
| | |
|---|---|
| *H01L 29/66* | (2006.01) |
| *H01L 21/8234* | (2006.01) |
| *H01L 29/78* | (2006.01) |
| *H01L 27/088* | (2006.01) |

(52) U.S. Cl.
CPC .................. *H01L 29/66545* (2013.01); *H01L 21/823431* (2013.01); *H01L 27/0886* (2013.01); *H01L 29/66795* (2013.01); *H01L 29/785* (2013.01)

(58) Field of Classification Search
CPC ....................... H01L 29/66545; H01L 29/6681
See application file for complete search history.

(56) References Cited

U.S. PATENT DOCUMENTS

| | | | |
|---|---|---|---|
| 8,053,346 B2 | 11/2011 | Ryu et al. | |
| 8,869,079 B2 | 10/2014 | Misaka et al. | |
| 9,318,478 B1 | 4/2016 | Bae et al. | |
| 2013/0154004 A1* | 6/2013 | Liu | ................... H01L 29/42376 257/347 |
| 2018/0040483 A1 | 2/2018 | Park et al. | |
| 2018/0350692 A1 | 12/2018 | Deng et al. | |
| 2019/0006487 A1* | 1/2019 | Huang | .............. H01L 21/02057 |
| 2019/0206867 A1 | 7/2019 | Lee et al. | |

* cited by examiner

*Primary Examiner* — Suberr L Chi
(74) *Attorney, Agent, or Firm* — Muir Patent Law, PLLC

(57) ABSTRACT

A semiconductor device may include: a dummy gate structure including a first gate pattern in which dummy gate lines extending in one direction are connected to each other on a substrate, and a second gate pattern in which dummy gate lines extending in the one direction are connected to each other on the same line with the first gate pattern; and a third gate pattern extending in parallel with the dummy gate structure on one side of the dummy gate structure.

20 Claims, 20 Drawing Sheets

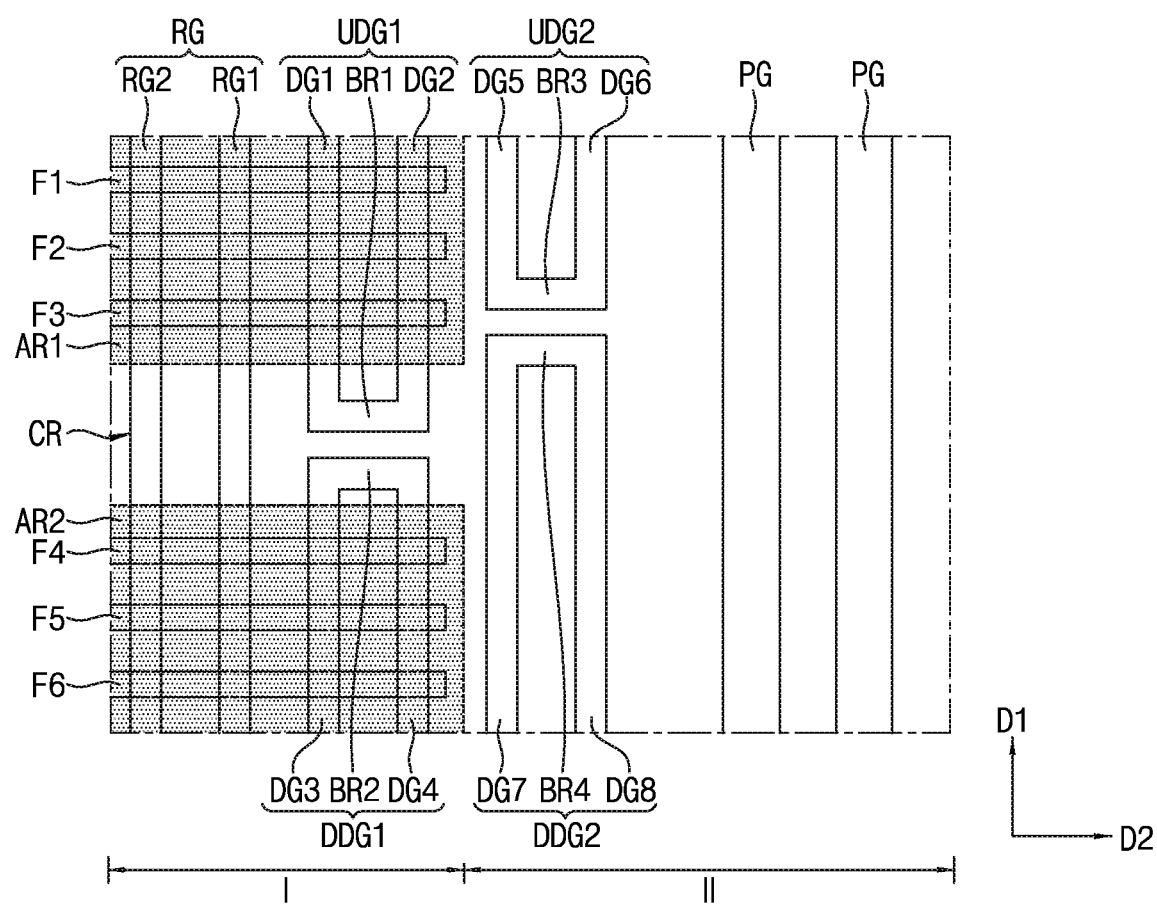

SEMICONDUCTOR DEVICE INCLUDING DUMMY GATE PATTERNS AND MANUFACTURING METHOD THEREOF

CROSS-REFERENCE TO THE RELATED APPLICATION

This U.S. non-provisional patent application claims priority under 35 U.S.C. § 119 to and the benefit of Korean Patent Application No. 10-2019-0047578, filed on Apr. 23, 2019, in the Korean Intellectual Property Office (KIPO), the disclosure of which is incorporated herein by reference in its entirety.

BACKGROUND

1. Field

The present inventive concept relates to a semiconductor device including gate patterns and a manufacturing method thereof.

2. Description of Related Art

Dummy patterns may be formed in a partial region of a substrate to increase pattern density and patternability. However, undercuts may occur in the dummy patterns, or the dummy patterns may be formed in an asymmetrical shape. Such unstable dummy patterns may act as a defect source in subsequent processes.

SUMMARY

The present inventive concept is directed to providing a semiconductor device including a stable dummy pattern.

In addition, the present inventive concept is directed to providing a method of manufacturing a semiconductor device on which the stable dummy pattern is formed.

According to an example embodiment, the disclosure is directed to a semiconductor device comprising: a dummy gate structure including a first gate pattern in which first dummy gate lines extending in a first direction are connected to each other on a substrate, and a second gate pattern in which second dummy gate lines extending in the first direction are connected to each other, the second dummy gate lines being aligned with the first dummy gate lines; and a third gate pattern extending in the first direction in parallel with the dummy gate structure on a first side of the dummy gate structure.

According to an example embodiment, the disclosure is directed to a semiconductor device comprising: a cell region including active fins extending in a first direction and real gate lines extending in a second direction, which intersects the first direction, and crossing the active fins; and a dummy region on which dummy gate structures extending in parallel with the real gate lines are disposed, wherein the dummy gate structures include: a pair of upper dummy gate lines extending in the second direction and disposed in parallel with each other; an upper bridge pattern connecting the pair of upper dummy gate lines to each other; a pair of lower dummy gate lines disposed to be spaced apart from the pair of upper dummy gate lines and the upper bridge pattern in the second direction; and a lower bridge pattern connecting the pair of lower dummy gate lines to each other.

According to an example embodiment, the disclosure is directed to a semiconductor device comprising: a first gate pattern extending in a first direction on a substrate; and a second gate pattern disposed adjacent to the first gate pattern in the first direction, wherein the first gate pattern comprises a first protrusion in which an inner sidewall of the first gate pattern, which is adjacent to the second gate pattern, protrudes toward the second gate pattern, and wherein the second gate pattern comprises a second protrusion in which an inner sidewall of the second gate pattern, which is adjacent to the first gate pattern, protrudes toward the first protrusion.

BRIEF DESCRIPTION OF THE DRAWINGS

FIG. 8A is a layout diagram for describing a semiconductor device according to an example embodiment of the present inventive concept.

DETAILED DESCRIPTION OF EXAMPLE EMBODIMENTS

Hereinafter, example embodiments of the inventive concept will be described in detail with reference to the accompanying drawings to clearly explain the technical idea of the inventive concept.

Figure 1A:
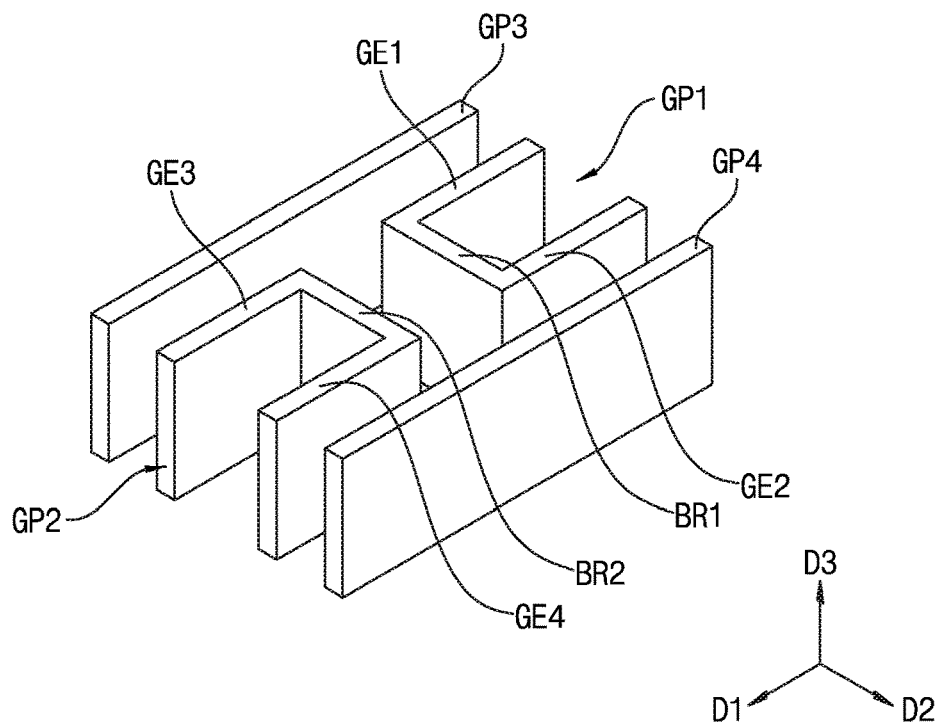
FIG. 1A is a perspective view for describing a semiconductor device according to an example embodiment of the present inventive concept.
Figure 1B:
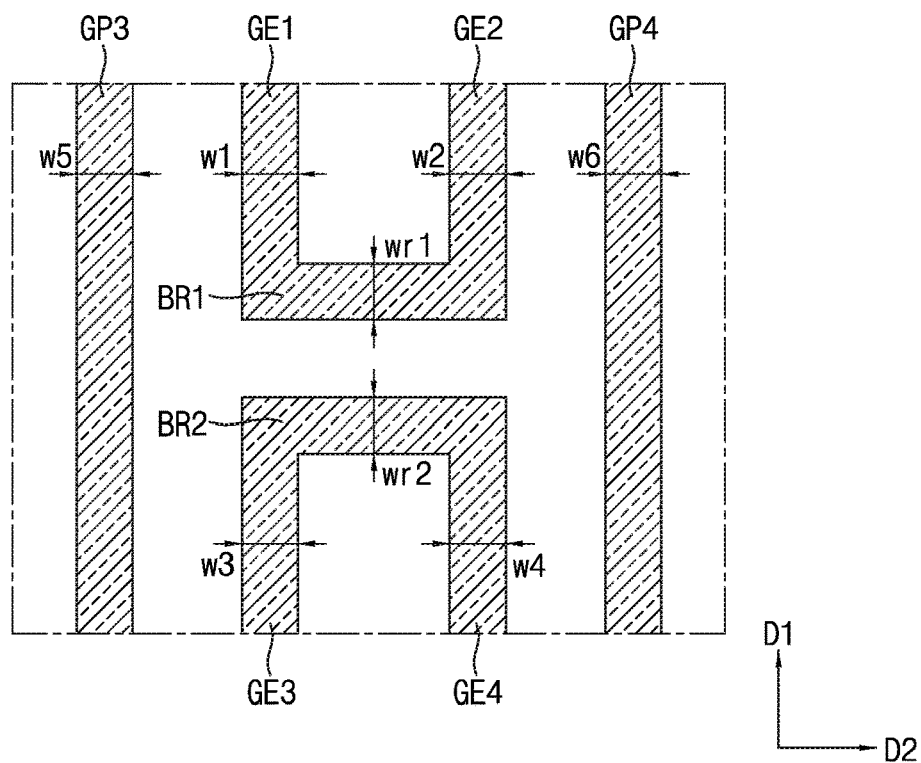
FIG. 1B is a plan view of a partial region of FIG. 1A.

FIG. 1A is a perspective view for describing a semiconductor device according to an example embodiment of the present inventive concept. FIG. 1B is a plan view of a partial region of FIG. 1A.

Referring to FIGS. 1A and 1B, the semiconductor device according to the example embodiment of the present inventive concept may include a plurality of gate patterns GP1, GP2, GP3, and GP4 on a substrate. The gate patterns GP1, GP2, GP3, and GP4 may include a first gate pattern GP1 and a second gate pattern GP2. The gate patterns GP1, GP2, GP3, and GP4 may include a conductive material. However, the present inventive concept is not limited thereto, and the gate patterns GP1, GP2, GP3, and GP4 may be made of a non-metal material such as polysilicon. Further, the gate patterns GP1, GP2, GP3, and GP4 may be a laminate of a metal electrode and a silicon electrode, but the present inventive concept is not limited thereto. For example, the metal electrode may include TiN, and the silicon electrode may include polysilicon.

The first gate pattern GP1 and the second gate pattern GP2 form one pair, and in the present specification, the pair of first gate pattern GP1 and second gate pattern GP2 may be referred to as a dummy gate structure. The first gate pattern GP1 may be referred to as an upper dummy gate structure and the second gate pattern GP2 may be referred to as a lower dummy gate structure.

The gate patterns GP1, GP2, GP3, and GP4 may include a line-shaped third gate pattern GP3 disposed on one side of each of the first gate pattern GP1 and the second gate pattern GP2, and a line-shaped fourth gate pattern GP4 disposed on the other side of each of the first gate pattern GP1 and the second gate pattern GP2. The third gate pattern GP3 and the fourth gate pattern GP4 may extend in parallel with the dummy gate structure and with one another. In the example embodiment, at least one of the third gate pattern GP3 and the fourth gate pattern GP4 may be a real gate line that intersects active fins to form a transistor.

The first gate pattern GP1 and the second gate pattern GP2 may be disposed to be spaced apart from each other. The first gate pattern GP1 may include a first gate line GE1, a second gate line GE2, and a first bridge pattern BR1. The second gate pattern GP2 may include a third gate line GE3, a fourth gate line GE4, and a second bridge pattern BR2.

The first gate line GE1 and the second gate line GE2 may each extend lengthwise in a first direction D1 (a longitudinal direction). An item, layer, or portion of an item or layer described as extending "lengthwise" in a particular direction has a length in the particular direction and a width perpendicular to that direction, where the length is greater than the width. The first gate line GE1 and the second gate line GE2 may be disposed to be spaced apart from each other in a second direction D2 (a transverse direction) that intersects the first direction D1. The first direction D1 may be orthogonal to the second direction D2. The first bridge pattern BR1 may extend in the second direction D2 between the first gate line GE1 and the second gate line GE2 to connect the first gate line GE1 to the second gate line GE2.

One end of the first bridge pattern BR1 may be connected to one end of the first gate line GE1, and the other end of the first bridge pattern BR1 may be connected to one end of the second gate line GE2. The first gate line GE1, the second gate line GE2, and the first bridge pattern BR1 may be connected to each other to form the first gate pattern GP1 having a U-shape. Upper surfaces of the first gate line GE1, the second gate line GE2, and the first bridge pattern BR1 may be positioned substantially on the same plane.

The third gate line GE3 and the fourth gate line GE4 may each extend lengthwise in the first direction D1. The third gate line GE3 and the fourth gate line GE4 may be disposed to be spaced apart from each other in the second direction D2 that intersects the first direction D1. The third gate line GE3 may be spaced apart from the first gate line GE1 in the first direction D1 and disposed substantially on the same line. For example, the first gate line GE1 and the third gate line GE3 may be aligned in the first direction D1. The fourth gate line GE4 may be spaced apart from the second gate line GE2 in the first direction D1 and disposed substantially on the same line. For example, the second gate line GE2 and the fourth gate line GE4 may be aligned in the first direction D1.

The second bridge pattern BR2 may extend in the second direction D2 between the third gate line GE3 and the fourth gate line GE4 to connect the third gate line GE3 to the fourth gate line GE4. One end of the second bridge pattern BR2 may be connected to one end of the third gate line GE3 and the other end of the second bridge pattern BR2 may be connected to one end of the fourth gate line GE4. The third gate line GE3, the fourth gate line GE4, and the second bridge pattern BR2 may be connected to each other to form the second gate pattern GP2 having an inverted-U shape. The second gate pattern GP2 may be symmetrical to the first gate pattern GP1. Upper surfaces of the third gate line GE3, the fourth gate line GE4, and the second bridge pattern BR2 may be positioned on the same plane. The second bridge pattern BR2 may be disposed parallel to the first bridge pattern BR1 in the first direction D1. The second bridge pattern BR2 may be disposed adjacent to the first bridge pattern BR1. One side surface of the first bridge pattern BR1 and one side surface of the second bridge pattern BR2 may be spaced apart from and face each other in the first direction D1. In the example embodiment, a width w1 of the first gate line GE1, a width w2 of the second gate line GE2, a width w3 of the third gate line GE3, a width w4 of the fourth gate pattern GP4, a width w5 of the third gate pattern GP3, and a width w6 of the fourth gate pattern GP4 may be substantially equal to each other. A width wr1 of the first bridge pattern BR1 and a width wr2 of the second bridge pattern BR2 may be substantially equal to each other. The width wr1 of the first bridge pattern BR1 and the width wr2 of the second bridge pattern BR2 may be substantially equal to the widths w1, w2, w3, and w4 of the gate lines GE1, GE2, GE3, and GE4 and the widths w5 and w6 of the third and fourth gate patterns GP3 and GP4. Alternatively, at least one of the width wr1 of the first bridge pattern BR1 and the width wr2 of the second bridge pattern BR2 may be different from the widths of the gate lines GE1, GE2, GE3, and GE4.

The first bridge pattern BR1 may be integrally formed with the first gate line GE1 and the second gate line GE2, and may include the same material. For example, the first bridge pattern BR1, the first gate line GE1, and the second gate line GE2 may be in material continuity with one another. The second bridge pattern BR2 may be integrally formed with the third gate line GE3 and the fourth gate line GE4, and may include the same material. For example, the second bridge pattern BR2, the third gate line GE3, and the fourth gate line GE4 may be in material continuity with one another. As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures.

Vertical cross-sectional shapes of the first gate pattern GP1 and the second gate pattern GP2 are illustrated in the drawing (refer to FIG. 1A) as being rectangular, but the present inventive concept is not limited thereto. The cross-sectional shapes of the first gate pattern GP1 and the second gate pattern GP2 may have a tapered shape whose width increases from an upper portion to a lower portion. Alternatively, the cross-sectional shapes of the first gate pattern GP1 and the second gate pattern GP2 may have a chamfered shape with rounded corners.

Figure 2A:
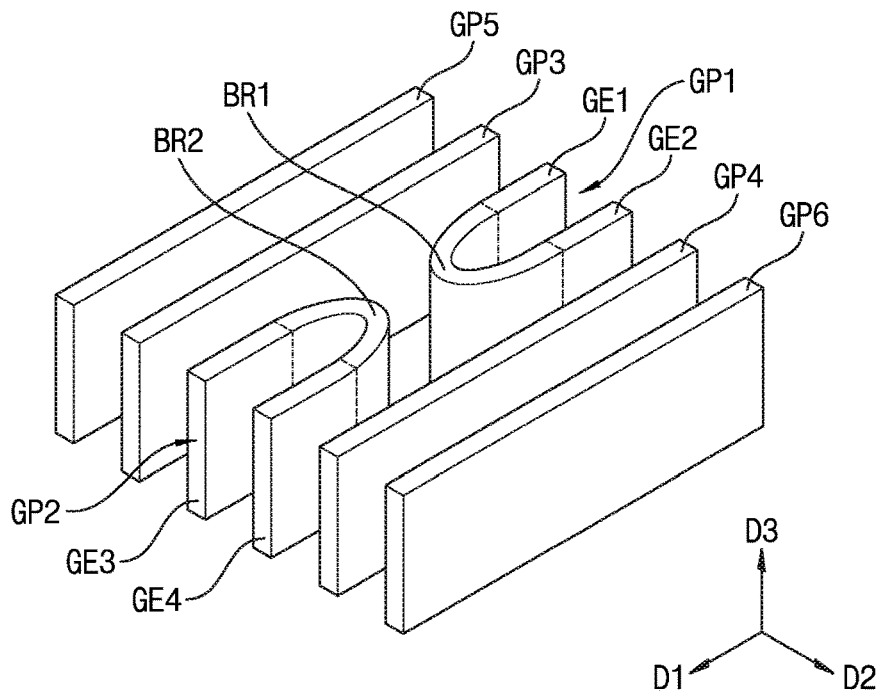
FIG. 2A is a perspective view for describing a semiconductor device according to an example embodiment of the present inventive concept.
Figure 2B:
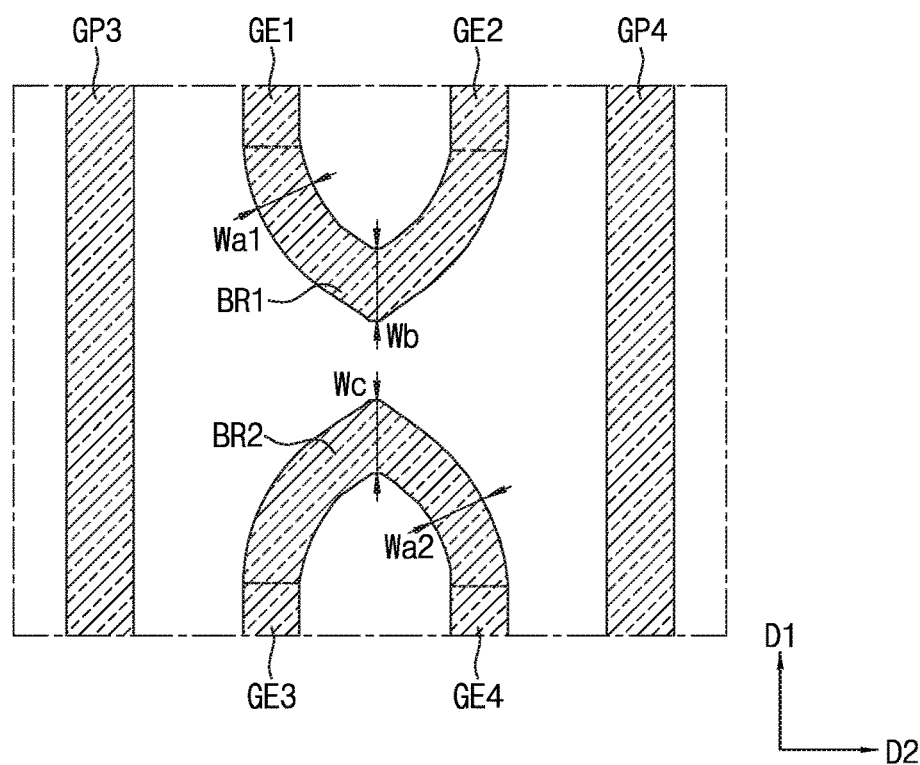
FIG. 2B is a plan view of a partial region of FIG. 2A.

FIG. 2A is a perspective view for describing a semiconductor device according to an example embodiment of the present inventive concept. FIG. 2B is a plan view of a partial region of FIG. 2A. In FIGS. 1A to 2B, the same reference numerals may represent the same components. A redundant description with the previously-described description will be omitted for the brevity of the description.

Referring to FIGS. 2A and 2B, the semiconductor device may include a first gate pattern GP1 and a second gate pattern GP2. Further, the semiconductor device may also include line-shaped third to sixth gate patterns GP3, GP4, GP5, and GP6 disposed on both sides of the first gate pattern GP1 and the second gate pattern GP2. As described above with reference to FIG. 1B, the first gate pattern GP1 may include a first gate line GE1, a second gate line GE2, and a first bridge pattern BR1. The second gate pattern GP2 may include a third gate line GE3, a fourth gate line GE4, and a second bridge pattern BR2.

In the example embodiment, a planar shape of the first bridge pattern BR1 may have a curved U-shape or inverted-arch shape. A planar shape of the second bridge pattern BR2 may have a curved inverted-U shape or arch shape. The first bridge pattern BR1 and the second bridge pattern BR2 may be symmetrical to each other. A width of at least a portion of the first bridge pattern BR1 may be substantially equal to a width of the first gate line GE1 and/or a width of the second gate line GE2. A width of at least a portion of the second bridge pattern BR2 may be substantially equal to a width of the third gate line GE3 and/or a width of the fourth gate line GE4. In the example embodiment, in the first bridge pattern BR1, a portion near the second bridge pattern BR2 may have a greater width than a portion relatively far from the second bridge pattern BR2. For example, in the first bridge pattern BR1, a width Wb of a center portion may be thicker than a width Wa1 of the other portions. Further, in the second bridge pattern BR2, a portion near the first bridge pattern BR1 may have a greater width than a portion relatively far from the first bridge pattern BR1. For example, in the second bridge pattern BR2, a width Wc of a center portion may be thicker than a width Wa2 of the other portions. In the example embodiment, the width of the first bridge pattern BR1 may be gradually narrower from a portion closest to the second bridge pattern BR2 toward the first gate line GE1 or the second gate line GE2. In some embodiments, at boundaries of the first bridge pattern BR1 and the first and second gate lines GE1 and GE2, the width of the first bridge pattern BR1 may be the same as widths of the first and second gate lines GE1 and GE2. The width of the second bridge pattern BR2 may be gradually narrower from a portion closest to the first bridge pattern BR1 toward the third gate line GE3 or the fourth gate line GE4. In some embodiments, at boundaries of the second bridge pattern BR2 and the third and fourth gate lines GE3 and GE4, the width of the second bridge pattern BR2 may be the same as widths of the third and fourth gate lines GE3 and GE4.

Figure 3A:
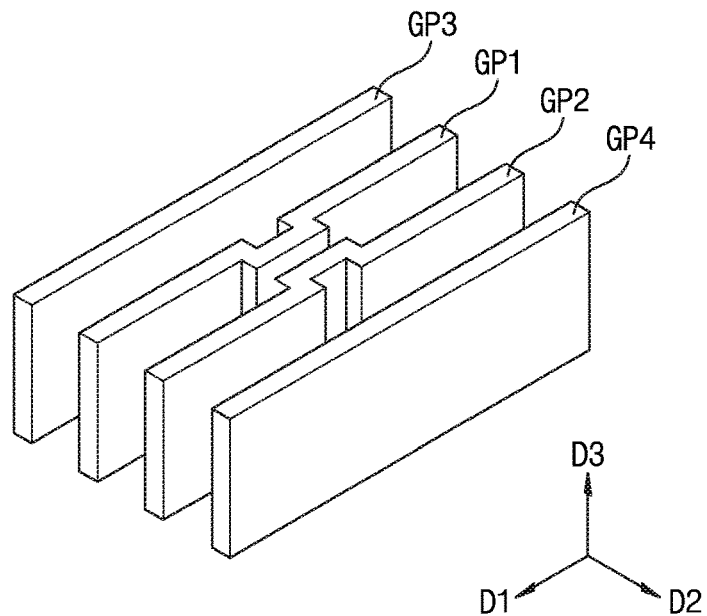
FIG. 3A is a perspective view for describing a semiconductor device according to an example embodiment of the present inventive concept.
Figure 3B:
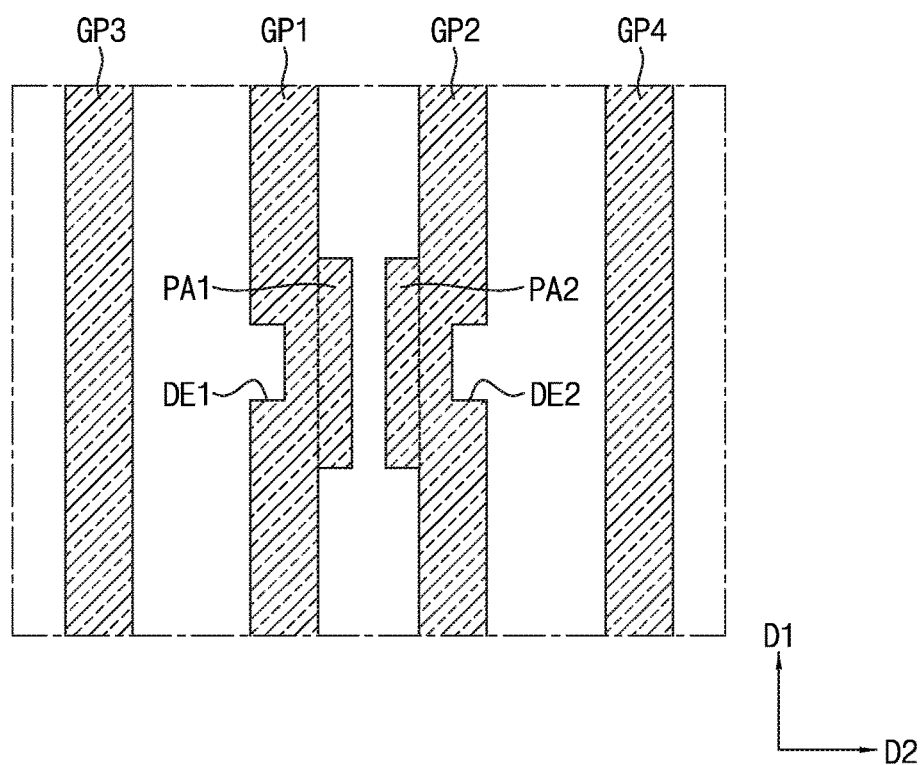
FIG. 3B is a plan view of a partial region of FIG. 3A.

FIG. 3A is a perspective view for describing a semiconductor device according to an example embodiment of the present inventive concept. FIG. 3B is a plan view of a partial region of FIG. 3A. In FIGS. 1A to 3B, the same reference numerals may represent the same components. A redundant description with the previously-described description will be omitted for the brevity of the description.

Referring to FIGS. 3A and 3B, the semiconductor device may include a first gate pattern GP1 and a second gate pattern GP2. The semiconductor device may include a third gate pattern GP3 and a fourth gate pattern GP4 disposed on one side of the first gate pattern GP1 and on one side of the second gate pattern GP2, respectively. The first gate pattern GP1 may include a first protrusion PA1 and a first recess DE1. The second gate pattern GP2 may include a second protrusion PA2 and a second recess DE2.

The first protrusion PA1 may be formed to protrude from an inner sidewall of the first gate pattern GP1 toward the second gate pattern GP2, facing one sidewall of the second gate pattern GP2. An outer sidewall of the first gate pattern GP1 may be concavely recessed toward the inner sidewall to form the first recess DE1. The first recess DE1 may be formed at a position corresponding to the first protrusion PA1 in a first direction D1. In the example embodiment, a width of the first protrusion PA1 in a second direction D2 may substantially correspond to a width of the first recess DE1 in the second direction D2. A length of the first protrusion PA1 in the first direction D1 may be greater than a length of the first recess DE1 in the first direction D1.

The second protrusion PA2 may be formed to protrude from an inner sidewall of the second gate pattern GP2 toward the first gate pattern GP1, facing the inner sidewall of the first gate pattern GP1. The second protrusion PA2 may be formed at a position corresponding to the first protrusion PA1 in the first direction D1 and may extend in the second direction D2 toward the first protrusion PA1. An outer sidewall of the second gate pattern GP2 may be concavely recessed toward the inner sidewall to form the second recess DE2. The second protrusion PA2 and the second recess DE2 may be symmetrical to the first protrusion PA1 and the first recess DE1, respectively.

Figure 4A:
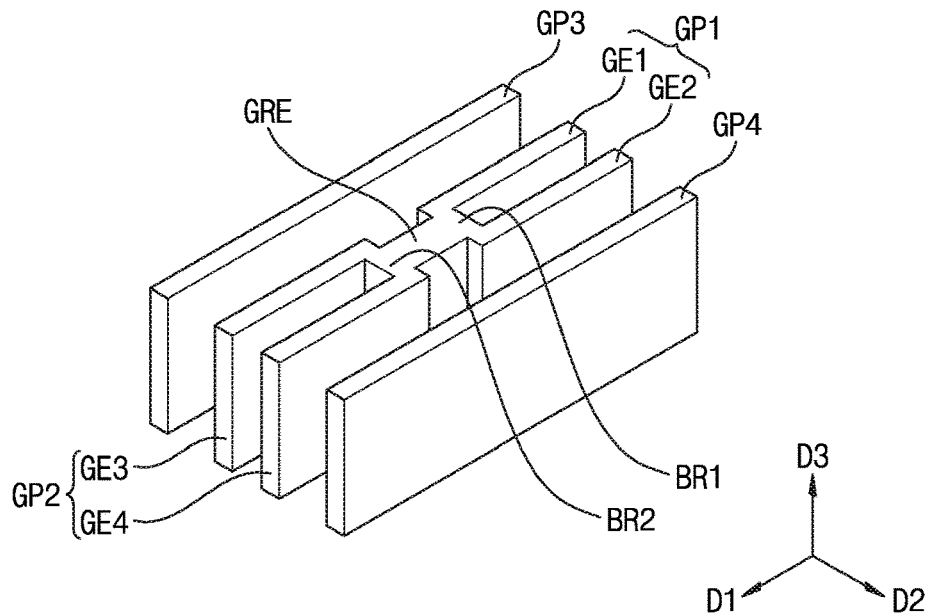
FIG. 4A is a perspective view for describing a semiconductor device according to an example embodiment of the present inventive concept.
Figure 4B:
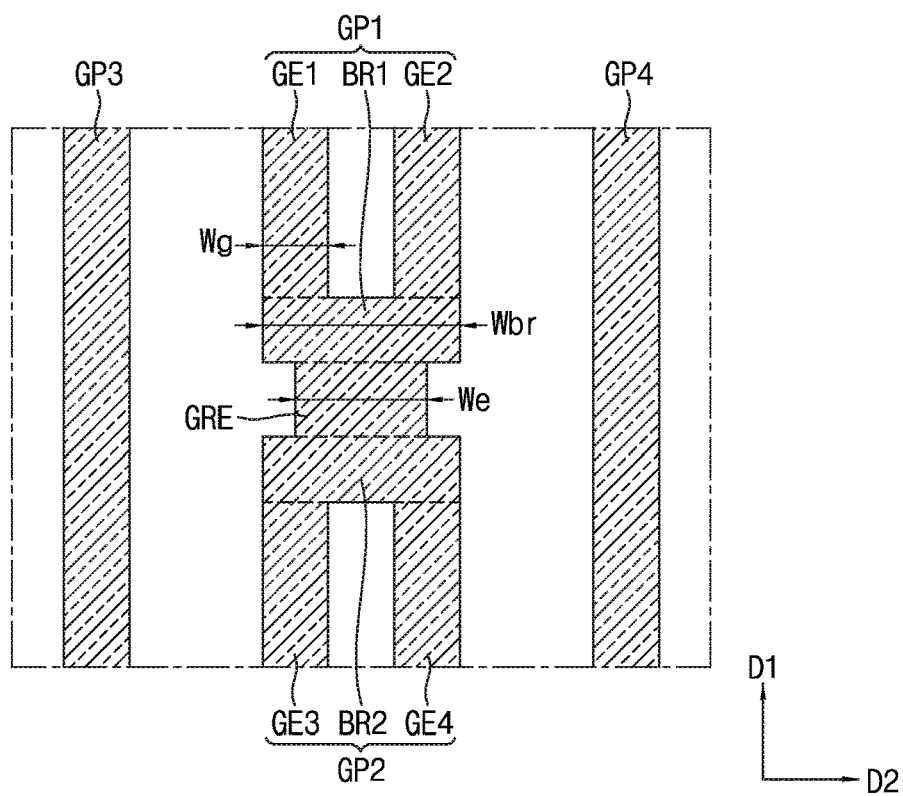
FIG. 4B is a plan view of a partial region of FIG. 4A.

FIG. 4A is a perspective view for describing a semiconductor device according to an example embodiment of the present inventive concept. FIG. 4B is a plan view of a partial region of FIG. 4A. In FIGS. 1A to 4B, the same reference numerals may represent the same components. A redundant description with the previously-described description will be omitted for the brevity of the description.

Referring to FIGS. 4A and 4B, the semiconductor device may include a first gate pattern GP1, a second gate pattern GP2, and a gate bridge pattern GRE. In some embodiments, the first gate pattern GP1, the second gate pattern GP2, and the gate bridge pattern GRE may be in material continuity with one another. The semiconductor device may include a third gate pattern GP3 disposed on one side of each of the first gate pattern GP1, the second gate pattern GP2, and the gate bridge pattern GRE, and a fourth gate pattern GP4 disposed on the other side of each of the first gate pattern GP1, the second gate pattern GP2, and the gate bridge pattern GRE. The first gate pattern GP1 may include a first gate line GE1, a second gate line GE2, and a first bridge pattern BR1. The second gate pattern GP2 may include a third gate line GE3, a fourth gate line GE4, and a second bridge pattern BR2. The gate bridge pattern GRE may be referred to as a third bridge pattern BR3. The first gate pattern GP1 and the second gate pattern GP2 may have the same or similar configuration as those described with reference to FIGS. 1A and 1B.

The gate bridge pattern GRE may be disposed between the first gate pattern GP1 and the second gate pattern GP2. The gate bridge pattern GRE may be disposed between the first bridge pattern BR1 and the second bridge pattern BR2. The gate bridge pattern GRE may connect the first gate pattern GP1 to the second gate pattern GP2. The gate bridge pattern GRE may connect the first bridge pattern BR1 to the second bridge pattern BR2. In the gate bridge pattern GRE, one side may be in contact with at least a portion of the first bridge pattern BR1, and the other side may be in contact with at least a portion of the second bridge pattern BR2. A width We of the gate bridge pattern GRE in a second direction D2 may be smaller than a width Wbr of the first and second bridge patterns BR1 and BR2 in the second direction D2. In the example embodiment, the width We of the gate bridge pattern GRE in the second direction D2 may be greater than a width Wg of the first gate line GE1 in the second direction D2. For example, the width We of the gate bridge pattern GRE in the second direction D2 may be twice or more the width Wg of the gate lines GE1, GE2, GE3, and GE4 in the second direction D2. However, the present inventive concept is not limited thereto.

The first gate pattern GP1, the second gate pattern GP2, and the gate bridge pattern GRE may be integrally formed. Alternatively, the first gate pattern GP1, the second gate pattern GP2, and the gate bridge pattern GRE may be formed by connecting the first gate pattern GP1 and the second gate pattern GP2, which are illustrated in FIGS. 3A and 3B. For example, the first gate pattern GP1, the second gate pattern GP2, and the gate bridge pattern GRE illustrated in the FIGS. 4A and 4B may be formed when a first protrusion PA1 of the first gate pattern GP1 is in contact with a second protrusion PA2 of the second gate pattern GP2.

Figure 5A:
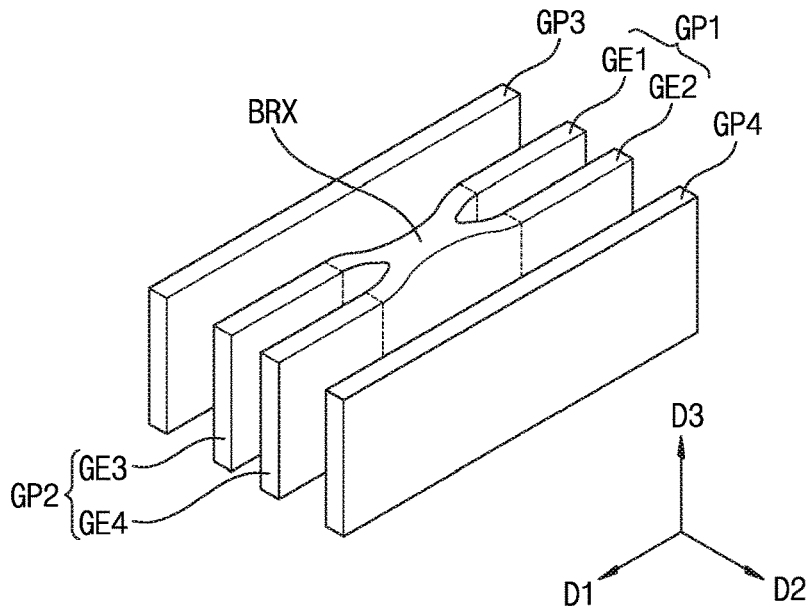
FIG. 5A is a perspective view for describing a semiconductor device according to an example embodiment of the present inventive concept.
Figure 5B:
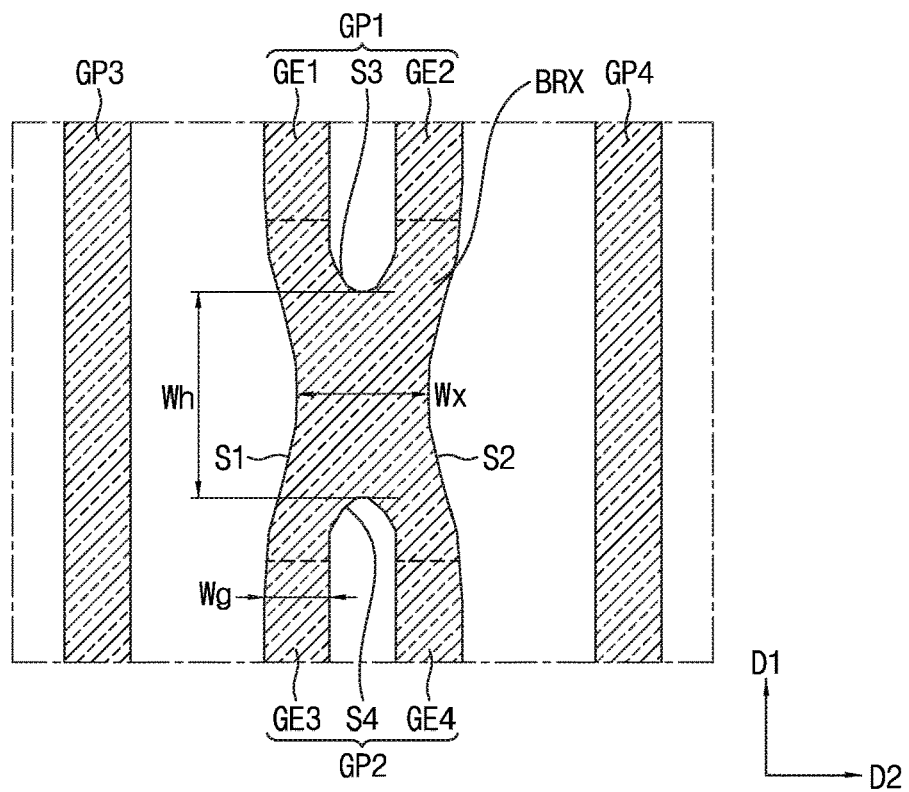
FIG. 5B is a plan view of a partial region of FIG. 5A

FIG. 5A is a perspective view for describing a semiconductor device according to an example embodiment of the present inventive concept. FIG. 5B is a plan view of a partial region of FIG. 5A. In FIGS. 1A to 5B, the same reference numerals may represent the same components. A redundant description with the previously-described description will be omitted for the brevity of the description.

Referring to FIGS. 5A and 5B, the semiconductor device may include a first gate pattern GP1, a second gate pattern GP2, a gate bridge pattern BRX, a third gate pattern GP3, and a fourth gate pattern GP4 on a substrate. In the present specification, the gate bridge pattern BRX may also be referred to as a bridge pattern or a third bridge pattern. The first gate pattern GP1 may include a first gate line GE1 and a second gate line GE2 extending lengthwise in a first direction D1 and in parallel with each other in the first direction D1. The second gate pattern GP2 may include a third gate line GE3 and a fourth gate line GE4 extending lengthwise in the first direction D1 and in parallel with each other in the first direction D1.

The gate bridge pattern BRX may be disposed between the first gate pattern GP1 and the second gate pattern GP2. The gate bridge pattern BRX may connect the first gate line GE1, the second gate line GE2, the third gate line GE3, and the fourth gate line GE4. The gate bridge pattern BRX may have an X-shape. The gate bridge pattern BRX may include a first outer sidewall S1, a second outer sidewall S2, a first inner sidewall S3, and a second inner sidewall S4. The first outer sidewall S1 may extend in the first direction D1 to connect an outer sidewall of the first gate line GE1 to an outer sidewall of the third gate line GE3. The second outer sidewall S2 may extend in the first direction D1 to connect an outer sidewall of the second gate line GE2 to an outer sidewall of the fourth gate line GE4. The first inner sidewall S3 may connect an inner sidewall of the first gate line GE1 to an inner sidewall of the second gate line GE2. For example, the first inner sidewall S3 may have a curved U shape. The second inner sidewall S4 may connect an inner sidewall of the third gate line GE3 to an inner sidewall of the fourth gate line GE4. For example, the second inner sidewall S4 may have a curved inverted-U shape.

In the example embodiment, the first outer sidewall S1 may have a curved surface recessed toward the inside of the gate bridge pattern BRX. The second outer sidewall S2 may also have a curved surface recessed toward the inside of the gate bridge pattern BRX. The first inner sidewall S3 may have a U-shaped curved surface in which one side thereof extends inward (rightward) and downward from one end of the first gate line GE1 and the other side thereof extends inward (leftward) and downward from one end of the second gate line GE2. The second inner sidewall S4 may have an inverted U-shaped (or arch-shaped) curved surface in which one side thereof extends inward (rightward) and upward from one end of the third gate line GE3 and the other side thereof extends inward (leftward) and upward from one end of the fourth gate line GE4.

In the example embodiment, in the gate bridge pattern BRX, the minimum width Wh in the first direction D1 may be greater than the minimum width Wx in the second direction D2. In some embodiments, the minimum width Wh in the first direction D1 may be the minimum distance between the first inner sidewall S3 and the second inner sidewall S4. The minimum width Wx of the gate bridge pattern BRX in the second direction D2 may be substantially equal to or less than twice a width Wg of the gate lines GE1, GE2, GE3, and GE4 in the second direction D2.

Figure 6A:
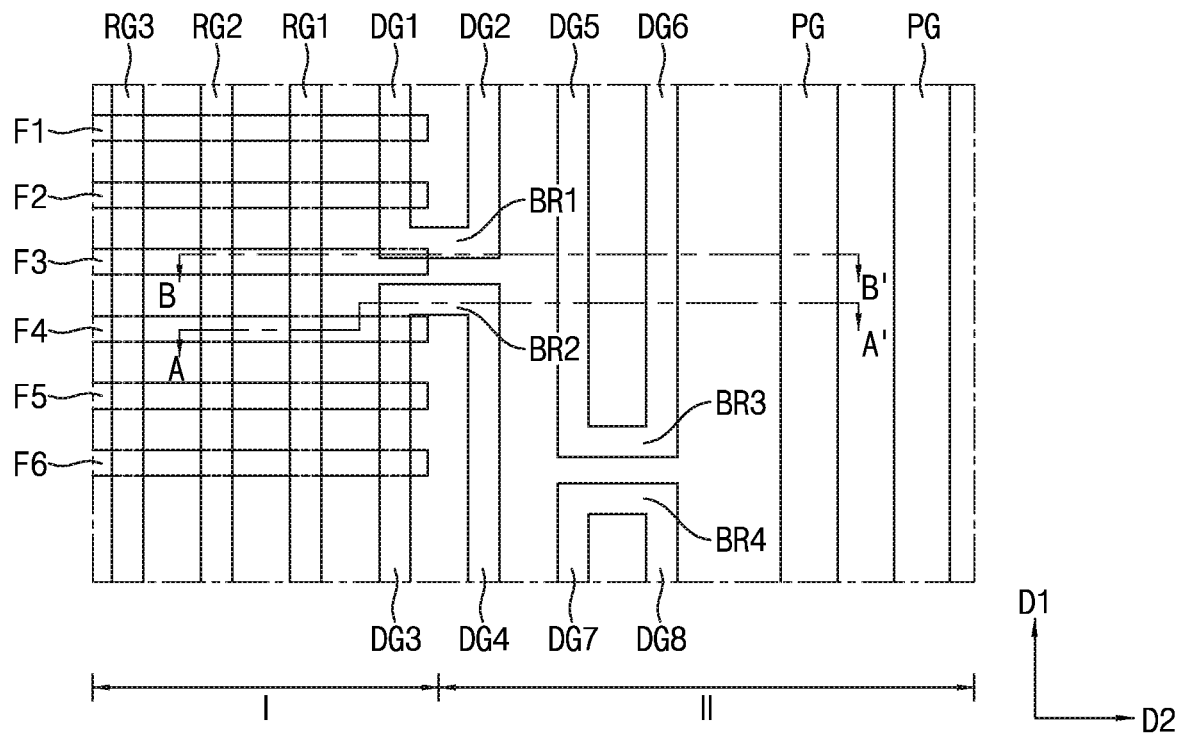
FIG. 6A is a layout diagram for describing a semiconductor device according to an example embodiment of the present inventive concept.
Figure 6B:
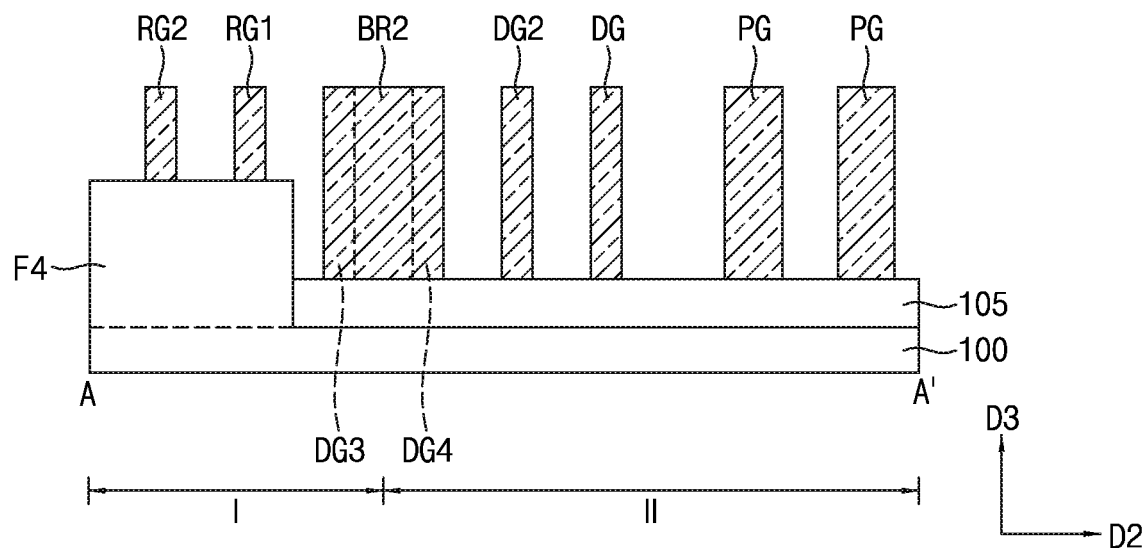
FIG. 6B is a cross-sectional view taken along line A-A' of FIG. 6A.
Figure 6C:
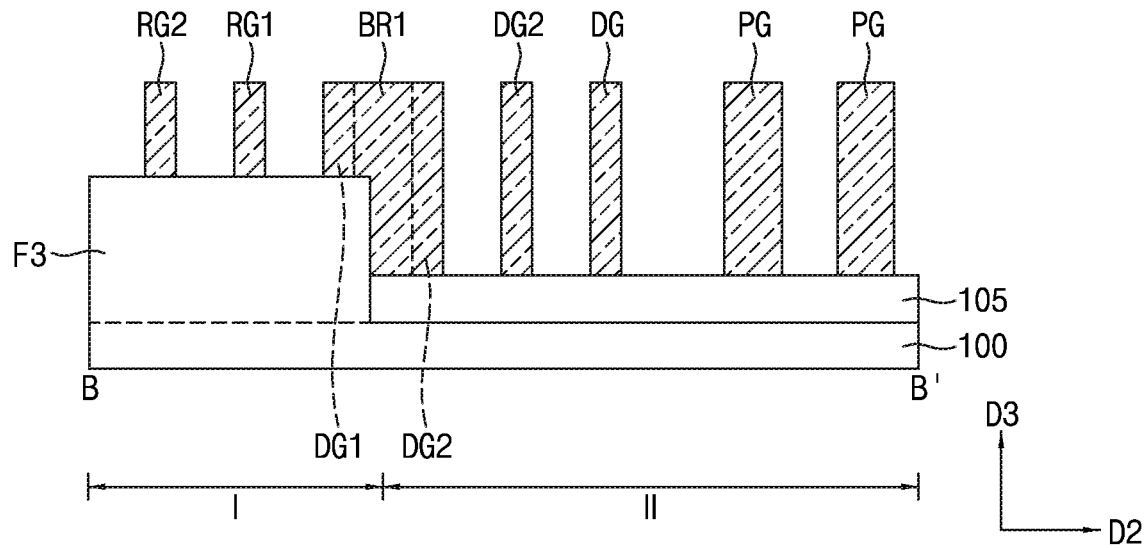
FIG. 6C is a cross-sectional view taken along line B-B' of FIG. 6A.

FIG. 6A is a layout diagram for describing a semiconductor device according to an example embodiment of the present inventive concept. FIG. 6B is a cross-sectional view taken along line A-A' of FIG. 6A. FIG. 6C is a cross-sectional view taken along line B-B' of FIG. 6A.

Referring to FIGS. 6A to 6C, the semiconductor device may include a first region I and a second region II disposed adjacent to the periphery of the first region I, on a substrate 100. In some embodiments, the second region II may be adjacent to the first region I in the second direction D2. For example, the first region I may be a cell region, and the second region II may be a dummy region. In some embodiments, a dummy region may comprise a region in which no active fins are formed. The second region II may be adjacent to ends of a plurality of parallel active fins and a border of the first region I and the second region II may be located between the ends of the active fins and the dummy gate lines disposed closest to the active fins without overlapping the active fins. For example, the border between the second region II and the first region I may be defined by the ends of the active fins in the first region I (as shown in FIG. 6A).

The semiconductor device may include a device isolation layer 105, a plurality of active fins F1, F2, F3, F4, F5, and F6, a plurality of real gate lines RG1, RG2, and RG3, a plurality of dummy gate lines DG1, DG2, DG3, DG4, DG5, and DG6, bridge patterns BR1, BR2, BR3, and BR4, and a plurality of field gate lines PG. The number of the plurality of active fins F1, F2, F3, F4, F5, and F6, the plurality of real gate lines RG1, RG2, and RG3, the plurality of dummy gate lines DG1, DG2, DG3, DG4, DG5, and DG6, and the plurality of field gate lines PG is not limited by the drawings, and may be greater or fewer than that illustrated.

A dummy gate line may be a conductive line formed at the same level and adjacent to normal gate lines or electrodes (e.g., normal word lines). A dummy gate line may be patterned from the same conductive layer(s) forming such normal word lines or electrodes. For example, a dummy gate line may be simultaneously formed with normal gate lines with the same processes that deposit and pattern the conductive layer(s) forming normal word lines. Dummy gate lines in memory devices are not effective to cause transmission of data to external devices. For instance, a dummy gate line may not be electrically connected to gates of memory cells, or if a dummy gate line is electrically connected to gates of dummy memory cells, such dummy gate lines may not be activated or if activated, may not result in communication of any data in such dummy memory cells to a source external to the memory device.

The device isolation layer 105 may be disposed on the first region I and the second region II on the substrate 100. The device isolation layer 105 may define the plurality of active fins F1, F2, F3, F4, F5, and F6 in the first region I. For example, the device isolation layer 105 may include an oxide.

The plurality of active fins F1, F2, F3, F4, F5, and F6 may be disposed on the substrate 100 in the first region I. The plurality of active fins F1, F2, F3, F4, F5, and F6 may not be disposed on the second region II, which is the dummy region. The plurality of active fins F1, F2, F3, F4, F5, and F6 may protrude in a direction perpendicular to a main surface of the substrate 100 (e.g., third direction D3). Upper surfaces of the plurality of active fins F1, F2, F3, F4, F5, and F6 may be positioned at a higher level than an upper surface of the device isolation layer 105. The plurality of active fins F1, F2, F3, F4, F5, and F6 may extend lengthwise in the second direction D2 (a transverse direction) and may be disposed to be spaced apart from each other in the first direction D1 (a longitudinal direction) that intersects the second direction D2. The plurality of active fins F1, F2, F3, F4, F5, and F6 may be portions of the substrate 100 and may include an epitaxial layer grown from the substrate 100.

The plurality of real gate lines RG1, RG2, and RG3 may be disposed on the device isolation layer 105 in the first region I. The plurality of real gate lines RG1, RG2, and RG3 may extend lengthwise in the first direction D1 in the first region I to cross the plurality of active fins F1, F2, F3, F4, F5, and F6. For example, the plurality of real gate lines RG1, RG2, and RG3 may include a conductive material. For example, the plurality of real gate lines RG1, RG2, and RG3 may include a metal, but the present inventive concept is not limited thereto, and may be made of a non-metal such as polysilicon. Further, the plurality of real gate lines RG1, RG2, and RG3 may be a laminate of a metal electrode and a silicon electrode, but the present inventive concept is not limited thereto. For example, the metal electrode may include TiN.

The plurality of dummy gate lines DG1, DG2, DG3, DG4, DG5, and DG6 may be disposed on the device isolation layer 105 in the first region I and/or the second region II. The plurality of dummy gate lines DG1, DG2, DG3, DG4, DG5, and DG6 may extend lengthwise in the first direction D1. The plurality of dummy gate lines DG1, DG2, DG3, DG4, DG5, and DG6 may be disposed to be spaced apart from each other in the second direction D2. The plurality of dummy gate lines DG1, DG2, DG3, DG4, DG5, and DG6 may be made of the same materials as the plurality of real gate lines RG1, RG2, and RG3.

In the example embodiment, the plurality of dummy gate lines DG1, DG2, DG3, DG4, DG5, and DG6 may include a first dummy gate line DG1 and a third dummy gate line DG3 disposed on the first region I, and a second dummy gate line DG2 and a fourth dummy gate line DG4 disposed on the second region II.

The first dummy gate line DG1 may be disposed within the first region I adjacent to the second region II. The second dummy gate line DG2 may be disposed within the second region II adjacent to the first region I. The first dummy gate line DG1 and the second dummy gate line DG2 may be disposed adjacent to each other in the second direction D2. In the example embodiment, the first dummy gate line DG1 may overlap at least portions of the plurality of active fins F1, F2, F3, F4, F5, and F6.

The third dummy gate line DG3 may be disposed within the first region I adjacent to the second region II. The third dummy gate line DG3 may be disposed substantially on the same line as the first dummy gate line DG1 and spaced apart from the first dummy gate line DG1 in the first direction D1. For example, the first dummy gate line DG1 and the third dummy gate line DG3 may be aligned in the first direction D1. In the example embodiment, the third dummy gate line DG3 may overlap at least portions of the plurality of active fins F1, F2, F3, F4, F5, and F6.

The fourth dummy gate line DG4 may be disposed adjacent to the first region I in the second region II. The fourth dummy gate line DG4 may be disposed adjacent to the third dummy gate line DG3 in the second direction D2. The fourth dummy gate line DG4 may be disposed substantially on the same line as the second dummy gate line DG2 and spaced apart from the second dummy gate line DG2 in the first direction D1. For example, the third dummy gate line DG3 and the fourth dummy gate line DG4 may be aligned in the first direction D1.

Fifth to eighth dummy gate lines DG5, DG6, DG7, and DG8 may be disposed adjacent to one side of each of the second dummy gate line DG2 and the fourth dummy gate line DG4 in the second region II. The first, second, fifth, and sixth dummy gate lines DG1, DG2, DG5, and DG6 may be referred to as upper dummy gate lines. The third, fourth, seventh, and eighth dummy gate lines DG3, DG4, DG7, and DG8 may be referred to as lower dummy gate lines.

Each of the bridge patterns BR1, BR2, BR3, and BR4 may extend in the second direction D2 in the first region I and/or the second region II to respectively connect a pair of two dummy gate lines, whose longitudinal sidewalls are adjacent to each other, among the plurality of dummy gate lines DG1, DG2, DG3, DG4, DG5, and DG6. A first bridge pattern BR1 may be connected to the first dummy gate line DG1 and the second dummy gate line DG2 over the first region I and the second region II. A second bridge pattern BR2 may be connected to the third dummy gate line DG3 and the fourth dummy gate line DG4 over the first region I and the second region II. The first bridge pattern BR1 and the second bridge pattern BR2 may be adjacent to each other in the first direction D1. A third bridge pattern BR3 may be connected to the fifth dummy gate line DG5 and the sixth dummy gate line DG6. A fourth bridge pattern BR4 may be connected to the seventh dummy gate line DG7 and the eighth dummy gate line DG8. The third bridge pattern BR3 and the fourth bridge pattern BR4 may be adjacent to each other in the first direction D1. The first bridge pattern BR1 and the third bridge pattern BR3 may be referred to as upper bridge patterns. The second bridge pattern BR2 and the fourth bridge pattern BR4 may be referred to as lower bridge patterns.

In the example embodiment, at least one of the bridge patterns BR1, BR2, BR3, and BR4 may overlap at least one of the plurality of active fins F1, F2, F3, F4, F5, and F6. In the example embodiment, the first bridge pattern BR1 may overlap a third active fin F3.

The field gate lines PG may extend lengthwise in the first direction D1 in the second region II. The field gate lines PG may be gate lines having a greater width in the second direction D2 than the real gate lines RG1, RG2, and RG3 or the dummy gate lines DG1, DG2, DG3, DG4, DG5, and DG6. In some embodiments, field gate lines PG may be peripheral gate lines.

The first dummy gate line DG1, the second dummy gate line DG2, and the first bridge pattern BR1 illustrated in FIGS. 6A to 6C may correspond to the first gate pattern GP1 described with reference to FIGS. 1A and 1B. The third dummy gate line DG3, the fourth dummy gate line DG4, and the second bridge pattern BR2 illustrated in FIGS. 6A to 6C may correspond to the second gate pattern GP2 described with reference to FIGS. 1A and 1B.

Figure 7:
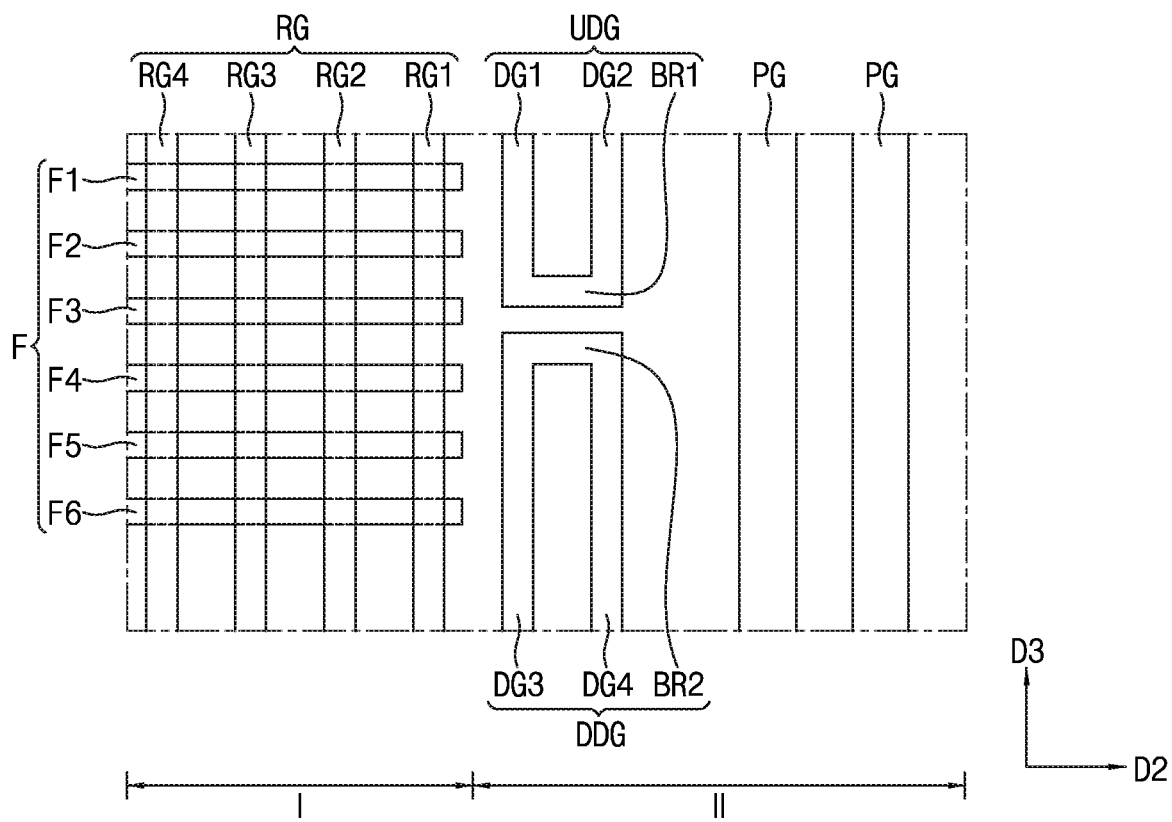
FIG. 7 is a layout diagram for describing a semiconductor device according to an example embodiment of the present inventive concept.

FIG. 7 is a layout diagram for describing a semiconductor device according to an example embodiment of the present inventive concept. In FIGS. 6A to 7, the same reference numerals may represent the same components. A redundant description with the previously-described description will be omitted for the brevity of the description.

Referring to FIG. 7, the semiconductor device may include a first region I and a second region II. The first region I may be a cell region, and the second region II may be a dummy region. Active fins F and real gate lines RG may be disposed to cross each other in the first region I. Dummy gate structures UDG and DDG and field gate lines PG may be disposed on the second region II in parallel with each other.

In the example embodiment, the dummy gate structures UDG and DDG may be disposed in the second region II adjacent to the first region I. The dummy gate structures UDG and DDG may not overlap the first region I. The dummy gate structures UDG and DDG may be disposed adjacent to one end of each of the active fins F.

The dummy gate structures UDG and DDG may include an upper dummy gate structure UDG and a lower dummy gate structure DDG. The upper dummy gate structure UDG may include a first dummy gate line DG1 and a second dummy gate line DG2, which are parallel to each other, and a first bridge pattern BR1 connecting the first dummy gate line DG1 to the second dummy gate line DG2. The lower dummy gate structure DDG may include a third dummy gate line DG3 and a fourth dummy gate line DG4, which are parallel to each other, and a second bridge pattern BR2 connecting the third dummy gate line DG3 to the fourth dummy gate line DG4.

FIG. 8A is a layout diagram for describing a semiconductor device according to an example embodiment of the present inventive concept. In FIGS. 6A to 8A, the same reference numerals may represent the same components. A redundant description with the previously-described description will be omitted for the brevity of the description.

Referring to FIG. 8A, the semiconductor device may include a first region I and a second region II. The first region I may be a cell region, and the second region II may be a dummy region. The first region I may include a first cell region AR1 and a second cell region AR2. The first region I may include a middle region CR disposed between the first cell region AR1 and the second cell region AR2. For example, the middle region CR may be disposed between adjacent groups of parallel active fins. The middle region CR may not contain any active fins or any memory cells and the width of the middle region CR in the first direction D1 may be greater than a pitch of the spacing of the parallel active fins in the first cell region AR1 (i.e., greater than the pitch of the spacing of active fins F3, F2, F1, . . . ) and in the second cell region AR2 (i.e., greater than the pitch of the spacing of active fins F4, F5, F6 . . . ) (where such pitch may be the same in both the first and second cell regions AR1 and AR2). It will also be apparent that the spacing between active fins F3 and F4 (the outermost active fins of first and second cell regions AR1 and AR2 that are immediately adjacent to each other) in which the middle region CR is formed is larger than the spacing between active fins in both the first and second cell regions AR1 and AR2.

First to third active fins F1, F2, and F3 may be disposed on the first cell region AR1. Fourth to sixth active fins F4, F5, and F6 may be disposed on the second cell region AR2. However, the number of fins disposed on the first cell region AR1 and the second cell region AR2 is not limited by the drawing, and may be greater or fewer than that illustrated.

Real gate lines RG (e.g., RG1 and RG2) may be disposed on the first region I. The real gate lines RG may extend lengthwise in a first direction D1 and may be disposed over the first cell region AR1, the second cell region AR2, and the middle region CR.

First dummy gate structures UDG1 and DDG1 may be disposed on the first region I. The first dummy gate structures UDG1 and DDG1 may include a first upper dummy gate structure UDG1 and a first lower dummy gate structure DDG1. At least a portion of the first upper dummy gate structure UDG1 may be disposed on the first cell region AR1, and at least a portion of the first lower dummy gate structure DDG1 may be disposed on the second cell region AR2.

The first upper dummy gate structure UDG1 may include a pair of upper dummy gate lines DG1 and DG2 disposed adjacent to and in parallel with each other and a first bridge pattern BR1. The first bridge pattern BR1 may be referred to as an upper bridge pattern. The pair of upper dummy gate lines DG1 and DG2 may include a first dummy gate line DG1 and a second dummy gate line DG2. The first bridge pattern BR1 may connect one end of the first dummy gate line DG1 to one end of the second dummy gate line DG2. The first dummy gate line DG1 and the second dummy gate line DG2 may be disposed on the first cell region AR1 and may extend lengthwise in the first direction D1 to be partially disposed on the middle region CR. The first bridge pattern BR1 may be disposed on the middle region CR.

The first lower dummy gate structure DDG1 may include a pair of lower dummy gate lines DG3 and DG4 disposed adjacent to and in parallel with each other and a second bridge pattern BR2. The second bridge pattern BR2 may be referred to as a lower bridge pattern. The pair of lower dummy gate lines DG3 and DG4 may include a third dummy gate line DG3 and a fourth dummy gate line DG4. The second bridge pattern BR2 may connect one end of the third dummy gate line DG3 to one end of the fourth dummy gate line DG4. The third dummy gate line DG3 and the fourth dummy gate line DG4 may be disposed on the first cell region AR1 and may extend lengthwise in the first direction D1 to be partially disposed on the middle region CR. The second bridge pattern BR2 may be disposed on the middle region CR. The second bridge pattern BR2 may be disposed adjacent to and in parallel with the first bridge pattern BR1.

Although the first dummy gate structures UDG1 and DDG1 are illustrated as being disposed on one side of the real gate lines RG in the drawing, in the example embodiment, the first dummy gate structures UDG1 and DDG1 may be disposed between the real gate lines RG. For example, the first dummy gate structures UDG1 and DDG1 may be disposed between a first real gate line RG1 and a second real gate line RG2.

Second dummy gate structures UDG2 and DDG2 may be disposed on the second region II, and may include a second upper dummy gate structure UDG2 including fifth and sixth dummy gate lines DG5 and DG6 and a third bridge pattern BR3 connecting the fifth and sixth dummy gate lines DG5 and DG6 to each other. The second dummy gate structures UDG2 and DDG2 may include a second lower dummy gate structure DDG2 including seventh and eighth dummy gate lines DG7 and DG8 and a fourth bridge pattern BR4 connecting the seventh and eighth dummy gate lines DG7 and DG8 to each other. For example, the second dummy gate structures UDG2 and DDG2 may have the same configuration as the dummy gate structures UDG and DDG described with reference to FIG. 7.

Figure 8B:
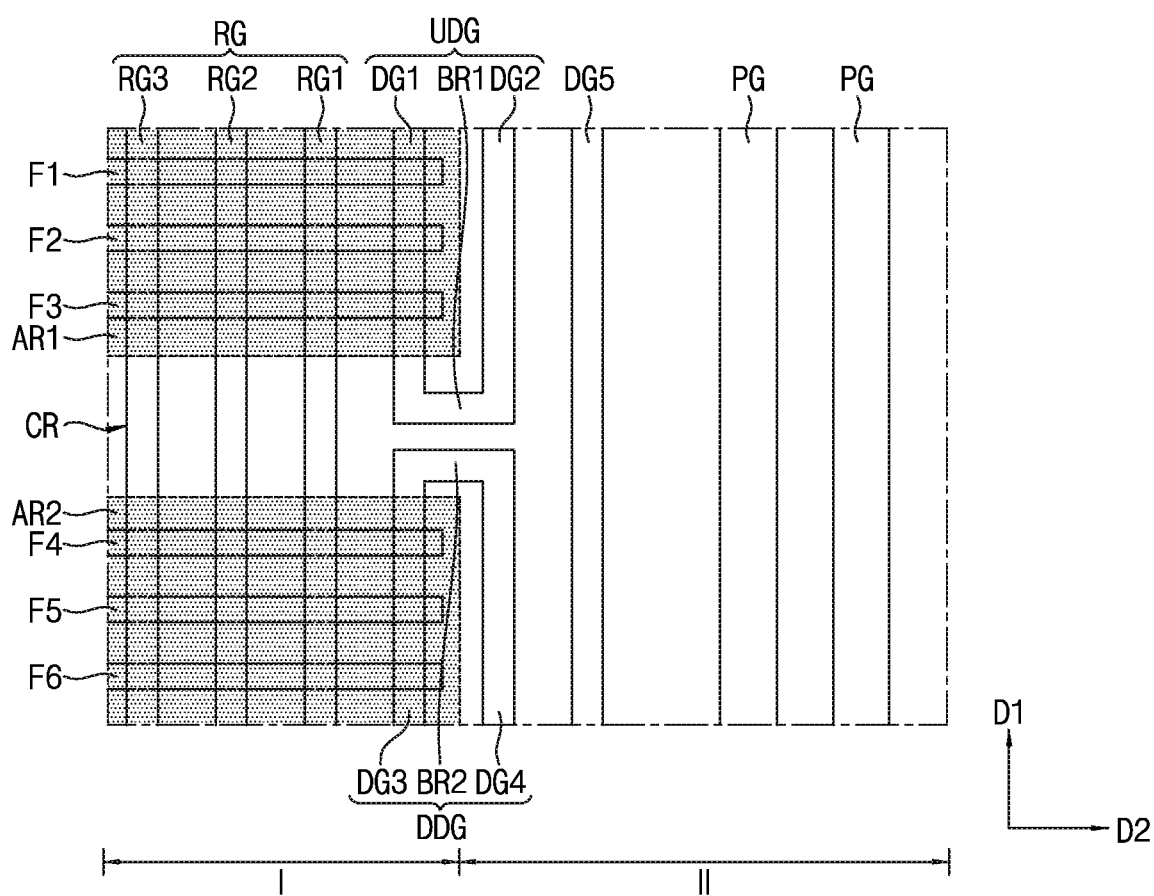
FIG. 8B is a layout diagram for describing a semiconductor device according to an example embodiment of the present inventive concept.

FIG. 8B is a layout diagram for describing a semiconductor device according to an example embodiment of the present inventive concept. In FIGS. 6A to 8B, the same reference numerals may represent the same components. A redundant description with the previously-described description will be omitted for the brevity of the description.

Referring to FIG. 8B, in the semiconductor device, real gate lines RG may be disposed in a first region I. Dummy gate structures UDG and DDG may overlap over the first region I and a second region II. The dummy gate structures UDG and DDG may include an upper dummy gate structure UDG and a lower dummy gate structure DDG. The upper dummy gate structure UDG may include a first dummy gate line DG1 and a second dummy gate line DG2, which are a pair of upper dummy gate lines, and a first bridge pattern BR1 connecting the first dummy gate line DG1 to the second dummy gate line DG2. The first bridge pattern BR1 may be referred to as an upper bridge pattern. The first dummy gate line DG1 may be disposed on a first cell region AR1 in the first region I. The first dummy gate line DG1 may extend lengthwise in a first direction D1 and be partially disposed on a middle region CR. The second dummy gate line DG2 may be disposed on the second region II to be adjacent to the first dummy gate line DG1. The second dummy gate line DG2 and the first dummy gate line DG1 may be parallel to one another. The first bridge pattern BR1 may connect one end of the first dummy gate line DG1 and one end of the second dummy gate line DG2 disposed on the middle region CR to each other. A portion of the first bridge pattern BR1 may be disposed on the middle region CR in the first region I, and the first bridge pattern BR1 may extend in a second direction D2 such that another portion thereof may be disposed in the second region II.

The lower dummy gate structure DDG may include a third dummy gate line DG3 and a fourth dummy gate line DG4, which are a pair of lower dummy gate lines, and a second bridge pattern BR2 connecting the third dummy gate line DG3 to the fourth dummy gate line DG4. The second bridge pattern BR2 may be referred to as a lower bridge pattern. The third dummy gate line DG3 may be disposed on a second cell region AR2. The third dummy gate line DG3 may extend lengthwise in the first direction D1 and be partially disposed on the middle region CR. The fourth dummy gate line DG4 may be disposed on the second region II to be adjacent to the third dummy gate line DG3. The fourth dummy gate line DG4 and the third dummy gate line DG3 may be parallel to one another. The second bridge pattern BR2 may extend in the second direction D2 to connect one end of the third dummy gate line DG3 to one end of the fourth dummy gate line DG4. The second bridge pattern BR2 may be disposed adjacent to the first bridge pattern BR1. A portion of the second bridge pattern BR2 may be disposed on the middle region CR of the first region I and another portion thereof may be disposed on the second region II.

In the example embodiment, the semiconductor device may further include at least one fifth dummy gate line DG5 between the dummy gate structures UDG and DDG and the field gate PG in the second region II. The fifth dummy gate line DG5 may extend lengthwise in the first direction D1.

Figure 8C:
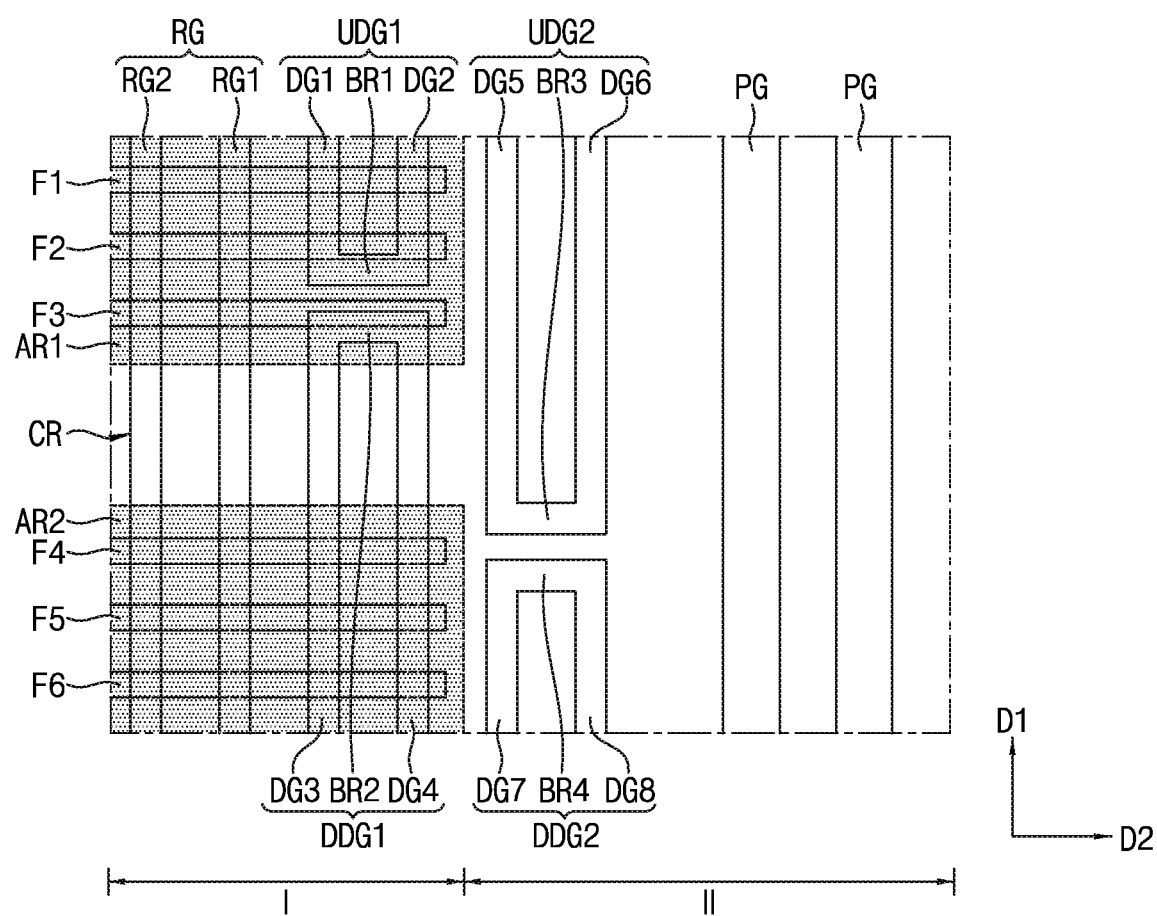
FIG. 8C is a layout diagram for describing a semiconductor device according to an example embodiment of the present inventive concept.

FIG. 8C is a layout diagram for describing a semiconductor device according to an example embodiment of the present inventive concept. In FIGS. 6A to 8C, the same reference numerals may represent the same components. A redundant description with the previously-described description will be omitted for the brevity of the description.

Referring to FIG. 8C, in the example embodiment, a first upper dummy gate structure UDG1 is disposed on a first cell region AR1, and a second upper dummy gate structure UDG2 may be disposed over the first cell region AR1, a middle region CR, and a second cell region AR2.

A first dummy gate line DG1, a second dummy gate line DG2, and a first bridge pattern BR1 (an upper bridge pattern) may be disposed on the first cell region AR1. A third dummy gate line DG3 and a fourth dummy gate line DG4 may extend in a first direction D1 from the second cell region AR2 to the first cell region AR1 through the middle region CR. The second bridge pattern BR2 (a lower bridge pattern) may connect one end of the third dummy gate line DG3 to one end of the fourth dummy gate line DG4 in the first cell region AR1.

Although not illustrated in the drawings, the gate patterns and bridge patterns illustrated in FIGS. 2A to 5B may be disposed on the first region I and/or the second region II in the same manner as the example embodiments described in FIGS. 6A to 8C. For example, the bridge patterns BR1, BR2, BR3, and BR4 may have a U-shape or an inverted-U shape as illustrated in FIGS. 2A and 2B. For example, the upper bridge pattern and the lower bridge pattern may be connected to each other to connect the upper dummy gate lines to the lower dummy gate lines as illustrated in FIGS. 4A, 4B, 5A, and 5B. The upper bridge pattern and the lower bridge pattern may be connected to each other to have an X-shape.

FIGS. 9 to 16 are drawings for describing a method of manufacturing a semiconductor device according to an example embodiment of the present inventive concept.

Figure 9:
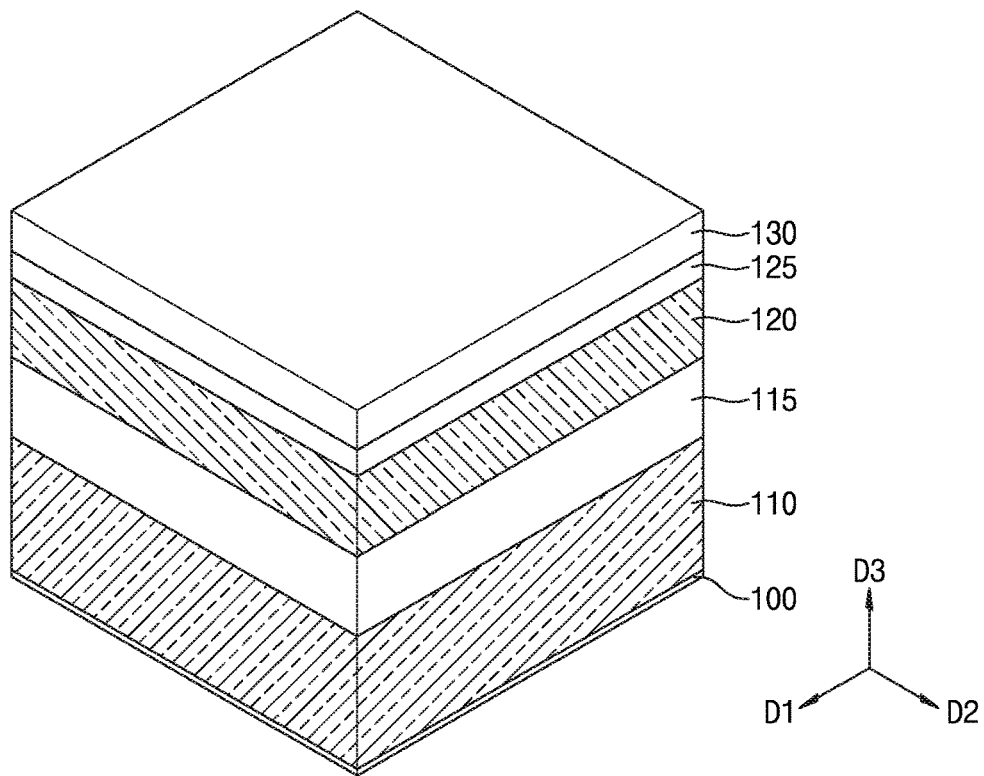
FIGS. 9 to 16 are drawings for describing a method of manufacturing a semiconductor device according to an example embodiment of the present inventive concept.

Referring to FIG. 9, a substrate 100 may be a bulk silicon substrate or a silicon-on-insulator (SOI) substrate. Alternatively, the substrate 100 may be a silicon substrate, or may include germanium, silicon germanium, indium antimonide, a lead tellurium compound, indium arsenide, indium phosphide, gallium arsenide, or gallium antimonide, but the present inventive concept is not limited thereto.

The substrate 100 may include a first region I and a second region II. For example, the first region I may be a cell region, and the second region II may be a dummy region, but the present inventive concept is not limited thereto. The dummy region may include a region in which dummy patterns are formed to increase pattern density and patternability. For example, the substrate 100 illustrated in FIG. 9 may be a partial region of the dummy region. Alternatively, the substrate 100 illustrated in FIG. 9 may be a partial region of the cell region. Alternatively, the substrate 100 illustrated in FIG. 9 may be a partial region overlapping the cell region and the dummy region.

A gate layer 110 may be disposed on the substrate 100. The gate layer 110 may include a material, for example, silicon, for forming a gate. For example, the gate layer 110 may include polycrystalline silicon (poly-Si). The gate layer 110 may include a metal material. Although not illustrated in the drawings, a device isolation layer may be further included between the substrate 100 and the gate layer 110. For example, the device isolation layer may include an oxide.

A first hard mask layer 115 may be disposed on the gate layer 110. The first hard mask layer 115 may include at least one of polysilicon, an oxide, and a nitride. The first hard mask layer 115 may be used to form hard mask patterns for etching gate patterns in subsequent processes.

A mask layer 120 and a second hard mask layer 125 may be disposed on the first hard mask layer 115. In the example embodiment, the mask layer 120 and the second hard mask layer 125 may have a similar etch selectivity. For example, the mask layer 120 may include polysilicon (for example, P-POLY). The second hard mask layer 125 may include a material similar to that of the first hard mask layer 115. The mask layer 120 and the second hard mask layer 125 may be used to form gate mask patterns.

A mandrel layer 130 may be disposed on the second hard mask layer 125. In the example embodiment, the mandrel layer 130 may include a material similar to that of the gate layer 110. The mandrel layer 130 may include a material having a different etch selectivity from that of the second hard mask layer 125. A double patterning technology (DPT), which uses a spacer disposed on a sidewall of a mandrel pattern as an etch mask, may be performed in a region in which a fine fin pitch is required.

Figure 10:
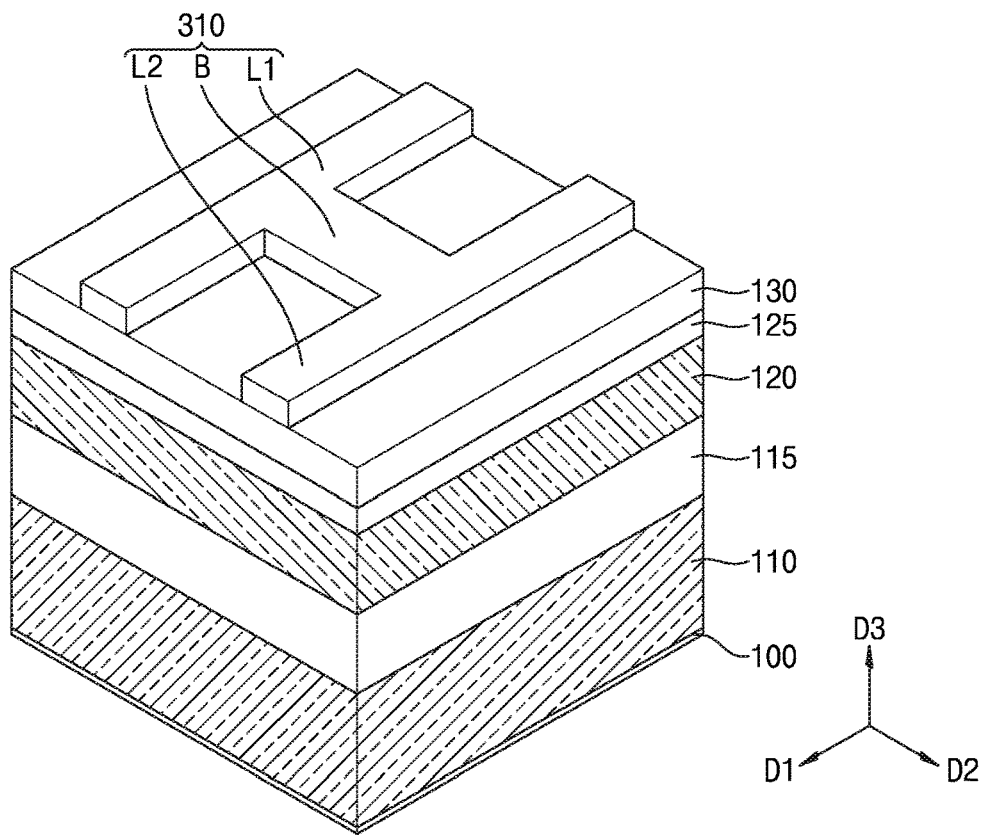

Referring to FIG. 10, a photoresist pattern 310 may be disposed on the mandrel layer 130. In the example embodiment, the photoresist pattern 310 may include an H-type pattern. For example, the photoresist pattern 310 may include a first line pattern L1 extending lengthwise in the first direction D1, a second line pattern L2 extending in parallel with the first line pattern L1, and a bridge pattern B extending in a second direction D2 between the first line pattern L1 and the second line pattern L2 to connect the first line pattern L1 to the second line pattern L2. Further, the photoresist pattern 310 may also include a line-shaped pattern (not shown in the drawing) extending only in the first direction D1 without being connected to the bridge pattern B. In some embodiments, the line-shaped pattern may be two line-shaped patterns, with a first line-shaped pattern disposed on one side of the first line pattern L1 and a second line-shaped pattern on one side of the second line pattern L2. The photoresist pattern 310 may be used as an etch mask for etching the mandrel layer 130.

Figure 11:
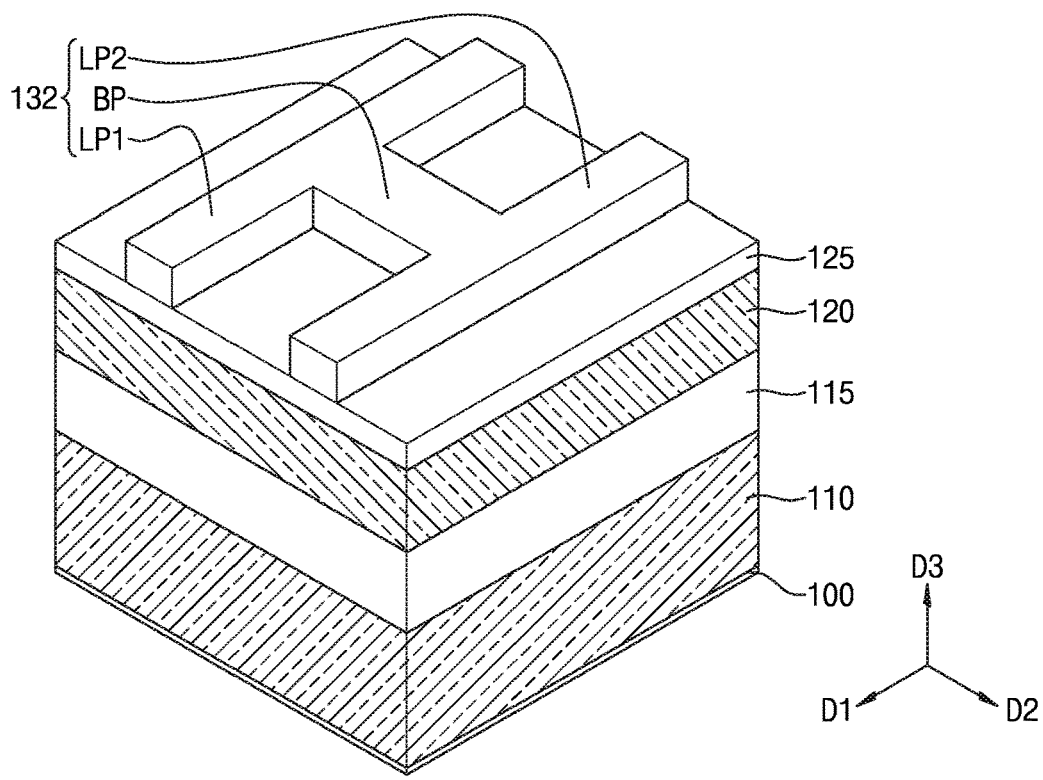

Referring to FIG. 11, a mandrel pattern 132 may be formed by etching the mandrel layer 130 using the photoresist pattern 310 as a mask. The mandrel pattern 132 may include an H-type pattern like the photoresist pattern 310. The mandrel pattern 132 may include a first line pattern LP1 extending lengthwise in the first direction D1, a second line pattern LP2 extending in parallel with the first line pattern LP1, and a bridge pattern BP extending in the second direction D2 between the first line pattern LP1 and the second line pattern LP2 to connect the first line pattern LP1 to the second line pattern LP2. The mandrel pattern 132 may further include line-shaped patterns (not shown in the drawings) each disposed on one side of the first line pattern LP1 and one side of the second line pattern LP2 and extending in the first direction D1.

Figure 12:
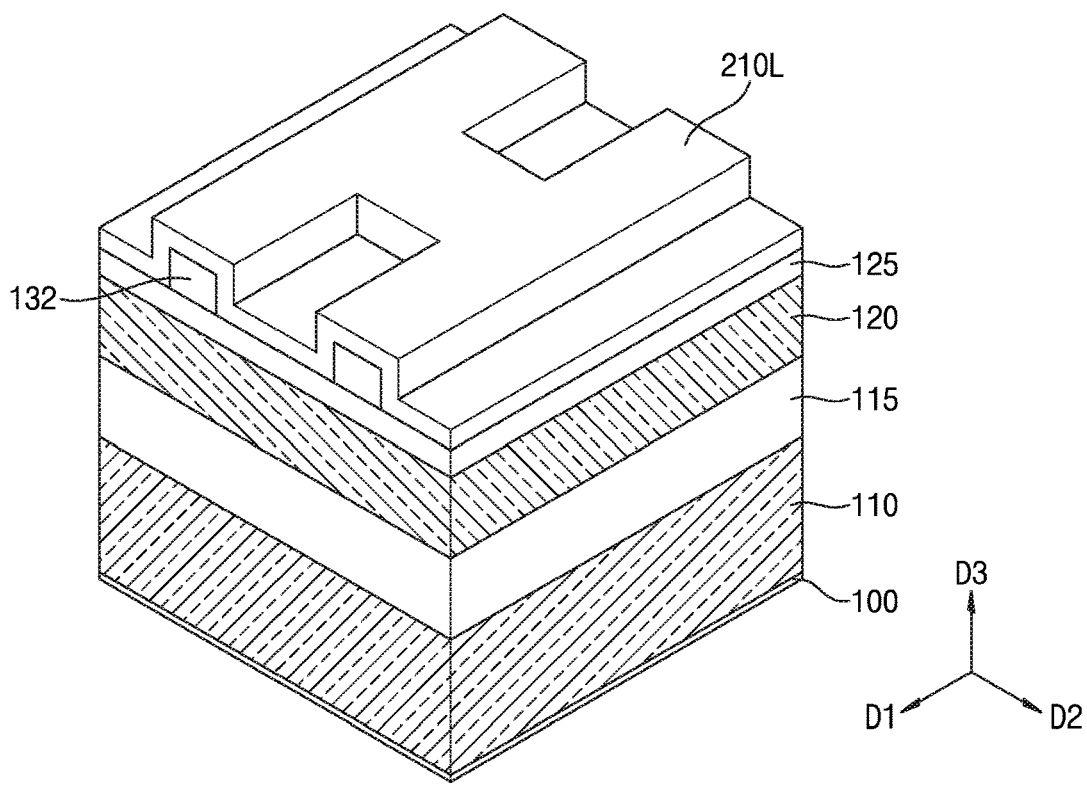

Referring to FIG. 12, a spacer layer 210L may be disposed on the mandrel pattern 132 and the second hard mask layer 125. The spacer layer 210L may conformally cover the mandrel pattern 132 and the second hard mask layer 125. For example, the spacer layer 210L may be formed through an atomic layer deposition (ALD) process. The spacer layer 210L may include a nitride or an oxynitride, but the present inventive concept is not limited thereto.

Figure 13:
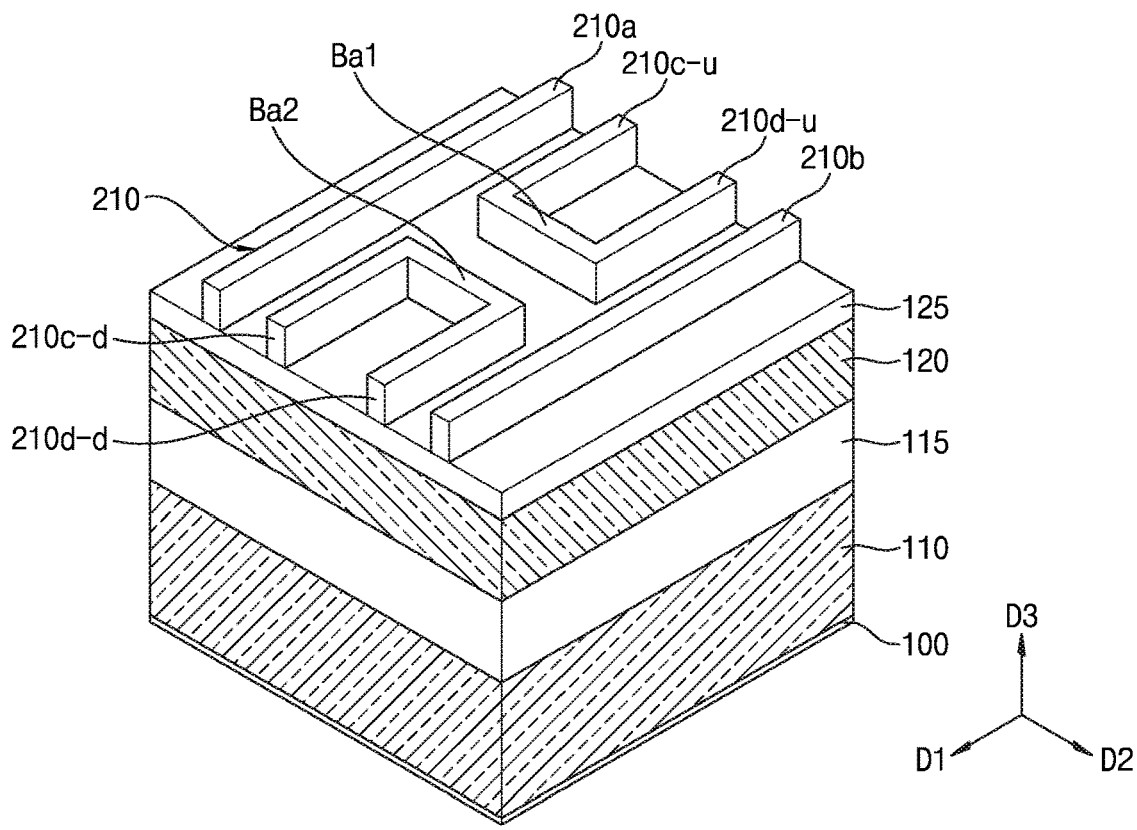

Referring to FIGS. 11 to 13, a portion of the spacer layer 210L on the second hard mask layer 125 may be removed, and a portion of a top surface of the second hard mask layer 125 may be exposed. Mandrel spacers 210 positioned on both sidewalls of the mandrel pattern 132 may be formed. The mandrel spacers 210 are formed, and the mandrel pattern 132 may be removed.

In the example embodiment, the mandrel spacers 210 may include outer spacers 210a and 210b positioned outside the mandrel pattern 132 and inner spacers 210c-u, 210c-d, 210d-u, 210d-d, Ba1, and Ba2 positioned inside the mandrel pattern 132.

The outer spacers 210a and 210b may include a first outer spacer 210a disposed outside the first line pattern LP1, and a second outer spacer 210b disposed outside the second line pattern LP2. The inner spacers 210c-u, 210c-d, 210d-u, 210d-d, Ba1, and Ba2 may include first inner spacers 210c-u and 210c-d disposed adjacent to the first line pattern LP1 and second inner spacers 210d-u and 210d-d disposed adjacent to the second line pattern LP2. The inner spacers 210c-u, 210c-d, 210d-u, 210d-d, Ba1, and Ba2 may also include bridge spacer Ba1 connecting the first inner spacer 210c-u to the second inner spacer 210d-u and bridge spacer Ba2 connecting the first inner spacer 210c-d to the second inner spacer 210d-d.

The first inner spacers 210c-u and 210c-d may be divided into a first upper spacer 210c-u positioned on an upper side and a first lower spacer 210c-d positioned on a lower side with respect to the bridge spacers Ba1 and Ba2. The second inner spacers 210d-u and 210d-d may be divided into a second upper spacer 210d-u positioned on the upper side and a second lower spacer 210d-d positioned on the lower side with respect to the bridge spacers Ba1 and Ba2.

The bridge spacers Ba1 and Ba2 may include a first bridge spacer Ba1 disposed on one side of the bridge pattern BP and a second bridge spacer Ba2 disposed on the other side of the bridge pattern BP. The first bridge spacer Ba1 may connect the first upper spacer 210c-u to the second upper spacer 210d-u. The second bridge spacer Ba2 may connect the first lower spacer 210c-d to the second lower spacer 210d-d.

The mandrel spacers 210 may be used as a mask for etching the mask layer 120 and the second hard mask layer 125. Pattern widths of mask patterns to be obtained by etching the mask layer 120 may be adjusted by adjusting a thickness of the mandrel spacer 210.

Figure 14:
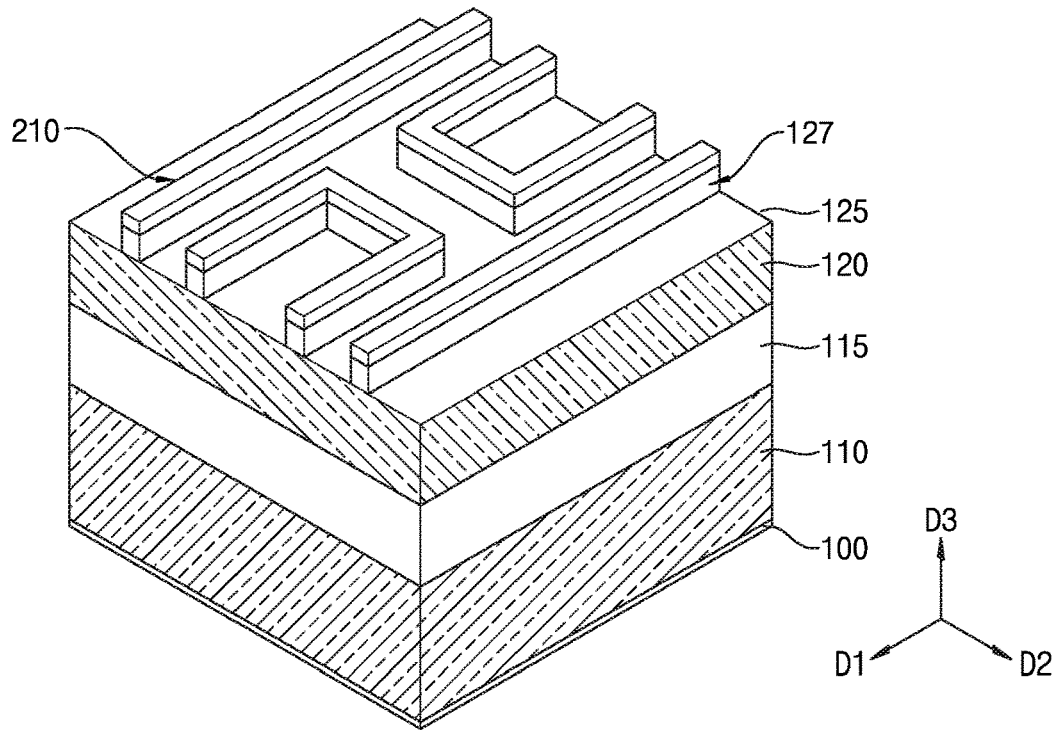

Referring to FIG. 14, at least a portion of the second hard mask layer 125 may be removed through an etching process in which the mandrel spacers 210 are used as an etch mask. The second hard mask layer 125 may be etched to form a second hard mask pattern 127 having a shape corresponding to the mandrel spacer 210.

Figure 15:
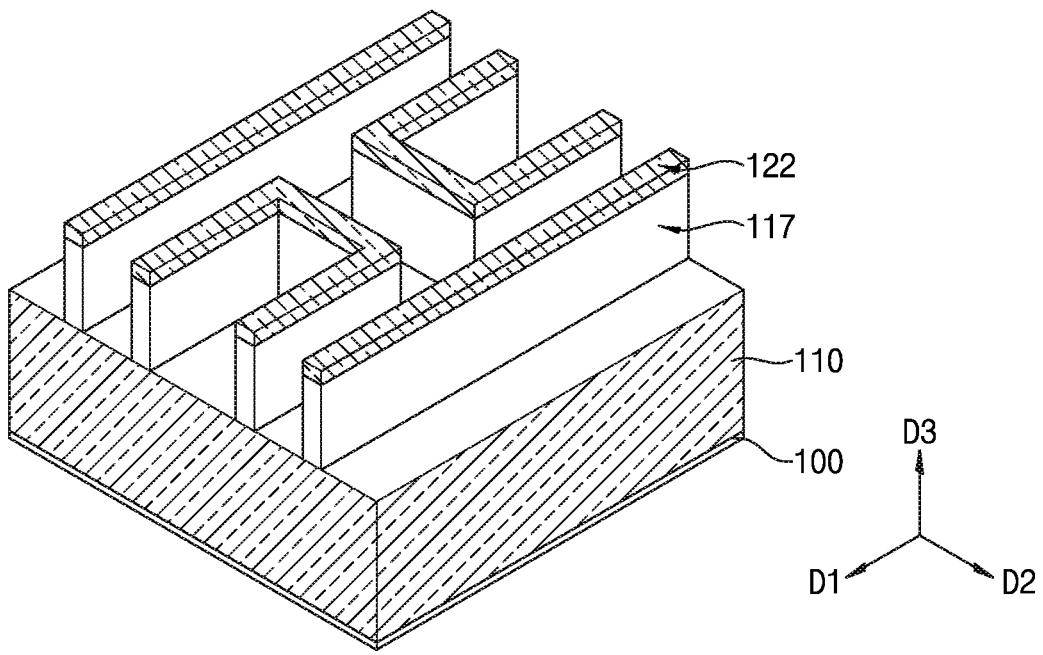

Referring to FIG. 15, at least portions of the mask layer 120 and the first hard mask layer 115 may be removed through an etching process in which the mandrel spacer 210 and the second hard mask pattern 127 are used as an etch mask. A first hard mask pattern 117 and a mask pattern 122 having shapes corresponding to the mandrel spacer 210 and/or the second hard mask pattern 127 may be formed by etching the first hard mask layer 115 and the mask layer 120.

The mandrel spacer 210 and the second hard mask pattern 127 may be removed in the process of forming the first hard mask pattern 117 and the mask pattern 122.

Figure 16:
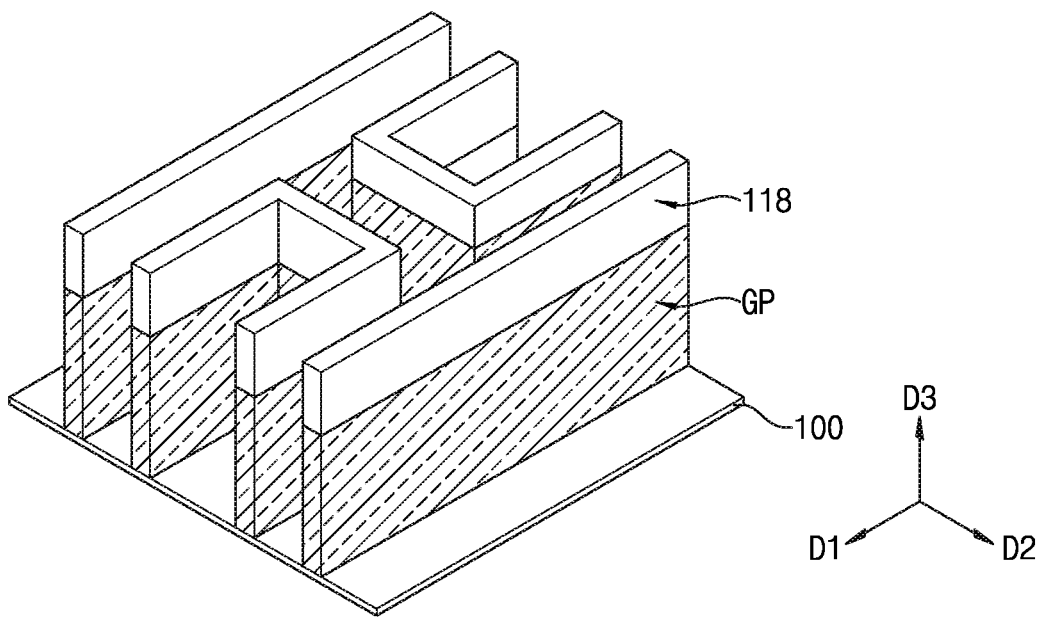

Referring to FIG. 16, at least a portion of the gate layer 110 may be removed through an etching process using the mask pattern 122 and the first hard mask pattern 117 as an etch mask. Gate patterns GP1, GP2, GP3, and GP4 having shapes corresponding to the mask pattern 122 and/or the first hard mask pattern 117 may be formed by etching the gate layer 110. The mask pattern 122 may be removed, and a top surface of the substrate 100 may be exposed in the process of forming the gate patterns GP1, GP2, GP3, and GP4. The first hard mask pattern 117 may be partially etched to have a lower height, thereby forming a hard mask pattern 118. The gate patterns GP1, GP2, GP3, and GP4 illustrated in FIG. 13 may correspond to the gate patterns GP1, GP2, GP3, and GP4 illustrated in FIGS. 1A and 1B.

Figure 17:
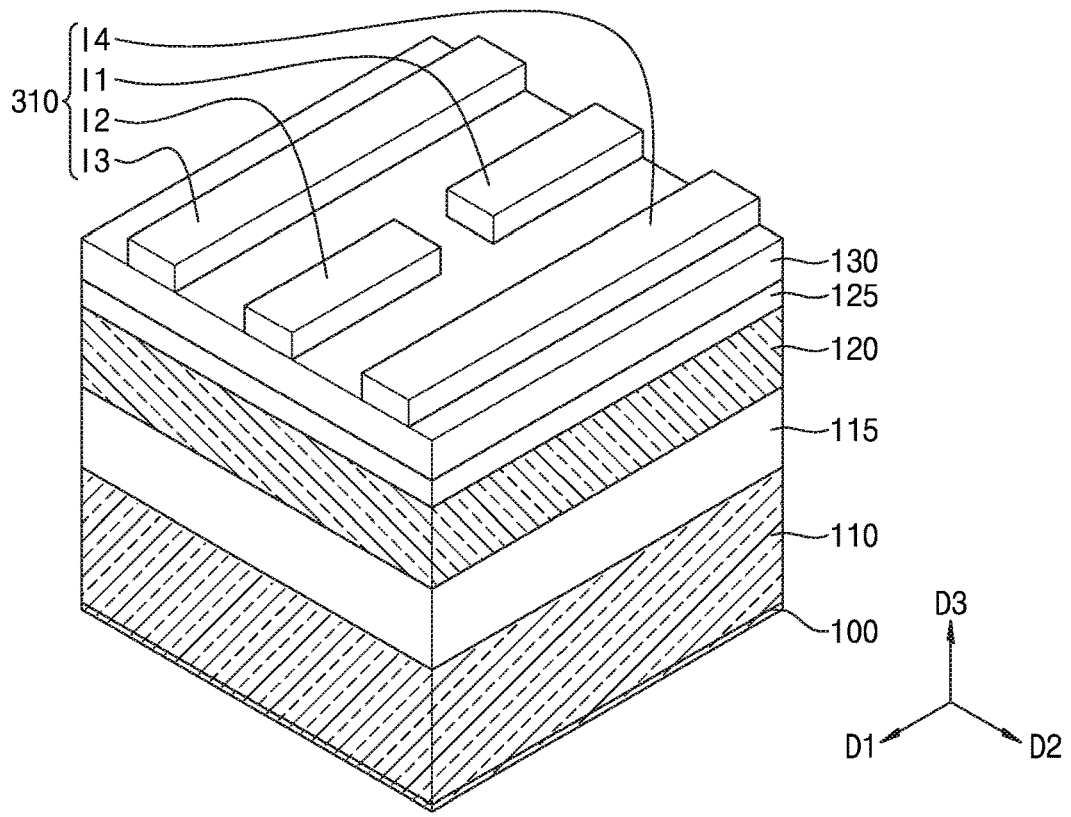
FIGS. 17 to 19 are drawings for describing a method of manufacturing a semiconductor device according to an example embodiment of the present inventive concept.
Figure 18:
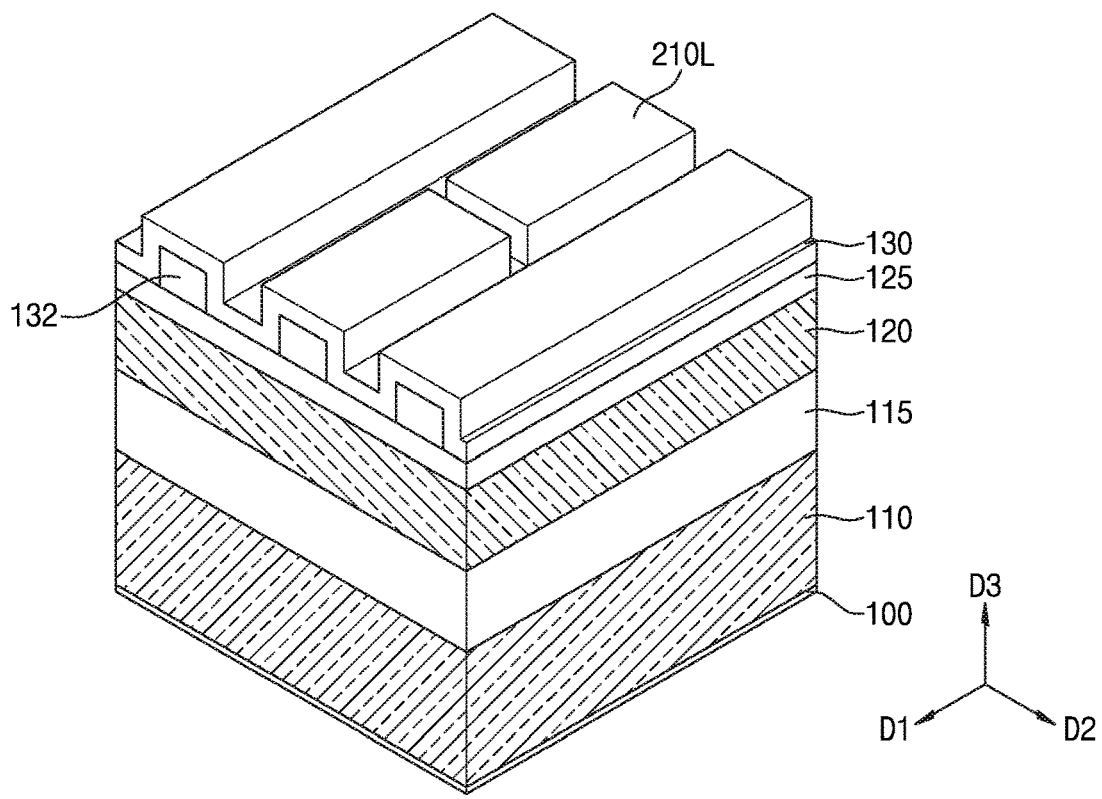
Figure 19:
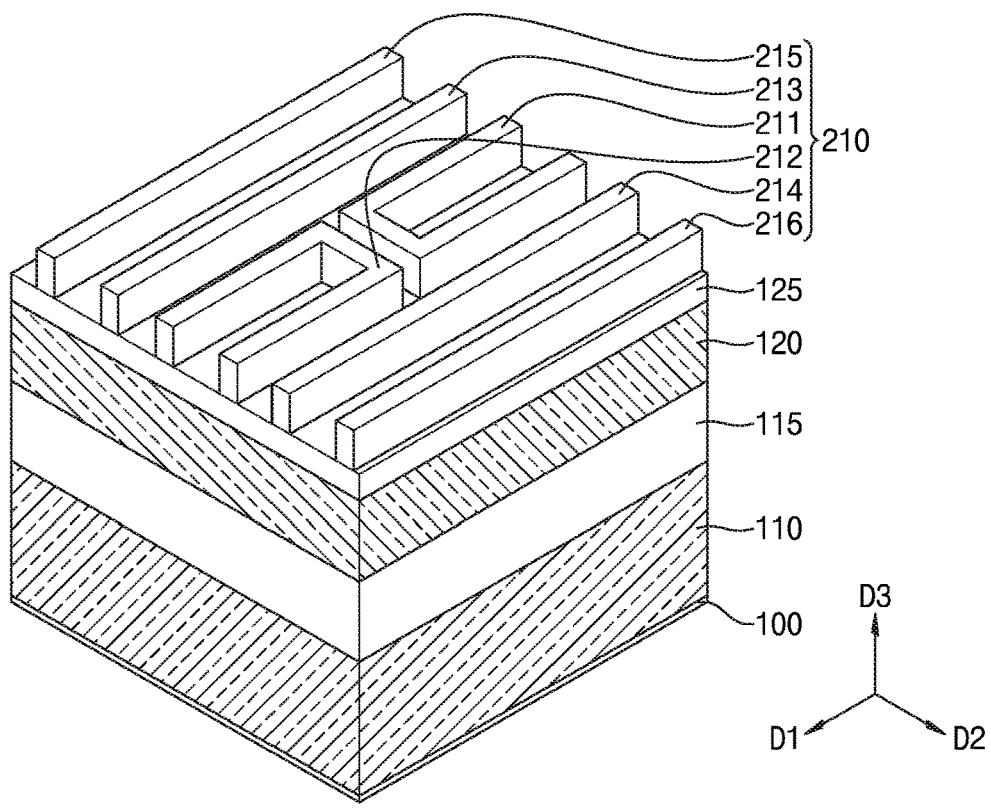

FIGS. 17 to 19 are drawings for describing a method of manufacturing a semiconductor device according to an example embodiment of the present inventive concept. In FIGS. 9 to 19, the same reference numerals denote the same components. Hereinafter, the contents substantially the same as those described in FIGS. 1A to 16 will be omitted for the simplicity of description.

Referring to FIG. 17, a photoresist pattern 310 may be disposed on a mandrel layer 130. The photoresist pattern 310 may include a first line pattern I1 and a second line pattern I2 that extend in the first direction D1 and are disposed on the same line. The first line pattern I1 and the second line pattern I2 may be spaced apart from each other at a predetermined interval. The photoresist pattern 310 may include a third line pattern I3 disposed on one side of each of the first line pattern I1 and the second line pattern I2, and a fourth line pattern I4 disposed on the other side of each of the first line pattern I1 and the second line pattern I2 in the second direction D2.

Referring to FIG. 18, at least a portion of the mandrel layer 130 may be removed through an etching process using the photoresist pattern 310 as an etch mask. The mandrel layer 130 may be etched to form a mandrel pattern 132. The mandrel pattern 132 may include a plurality of patterns corresponding to the photoresist pattern 310. The mandrel pattern 132 may be formed to have a planar shape corresponding to a planar shape of the photoresist pattern 310. A spacer layer 210L may conformally cover the mandrel pattern 132. In the example embodiment, a thickness of the spacer layer 210L may be smaller than half a separation distance between the first line pattern and the second line pattern in the first direction D1. A separation space may be left between the first line pattern L1 and the second line pattern L2 even after the spacer layer 210L covers the mandrel pattern 132.

Referring to FIG. 19, a portion of a spacer layer 210L on a second hard mask layer 125 may be removed, and a portion of a top surface of the second hard mask layer 125 may be exposed. Mandrel spacers 210 positioned on both sidewalls of the mandrel pattern 132 may be formed, and the mandrel pattern 132 may be removed.

The mandrel spacers 210 may include a first spacer 211 having a U-shaped planar shape, a second spacer 212 having an inverted U-shaped planar shape, and line-shaped spacers 213, 214, 215, and 216. In the example embodiment, the first spacer 211 and the second spacer 212 may have the same or similar configuration as the inner spacers 210c-u, 210c-d, 210d-u, 210d-d, Ba1, and Ba2 described with reference to FIG. 10. Subsequently, hard mask patterns and gate patterns corresponding to the planar shapes of the first spacer 211, the second spacer 212, and the line-shaped spacers 213, 214, 215, and 216 may be formed through the same or similar process as the etching process performed in the example embodiment of FIGS. 11 to 13. The gate patterns as illustrated in FIGS. 1A and/or 1B may be formed.

In the example embodiment, although not illustrated in the drawings, the mandrel pattern 132, which is formed using the first line pattern I1 and the second line pattern I2 as an etch mask, may have planar shapes different from planar shapes of the first line pattern I1 and the second line pattern I2 unlike the description in FIG. 15. For example, a shape between the photoresist pattern 310 and the mandrel pattern 132 may be different when the separation distance between the first line pattern I1 and the second line pattern I2 is smaller than a process minimum line width. Although the first line pattern I1 and the second line pattern I2 of the photoresist pattern 310 illustrated in FIG. 17 have planar surfaces at one end thereof facing each other, one end of the mandrel pattern 132 corresponding to the first line pattern I1 and one end of the mandrel pattern 132 facing the one end of the mandrel pattern 132 may have curved surfaces rather than planar surfaces. The gate pattern formed through the process of using the mandrel pattern having a curved one end as an etch mask may correspond to the gate pattern described in FIGS. 2A and 2B.

Figure 20:
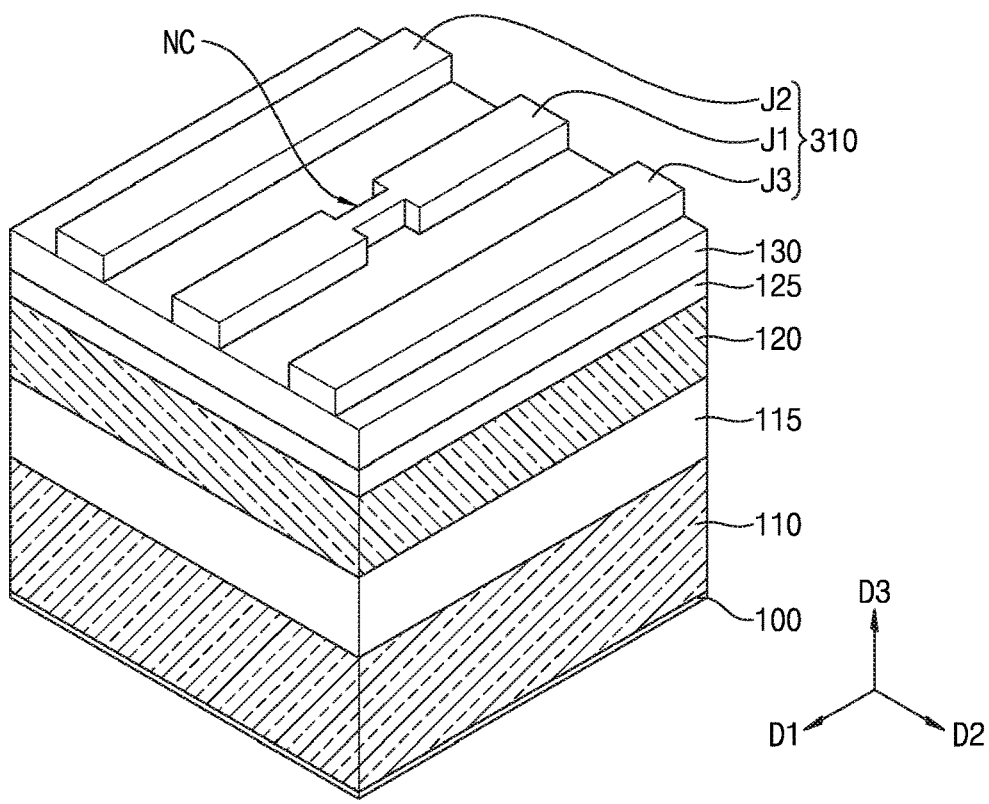
FIGS. 20 to 22 are drawings for describing a method of manufacturing a semiconductor device according to an example embodiment of the present inventive concept.
Figure 21:
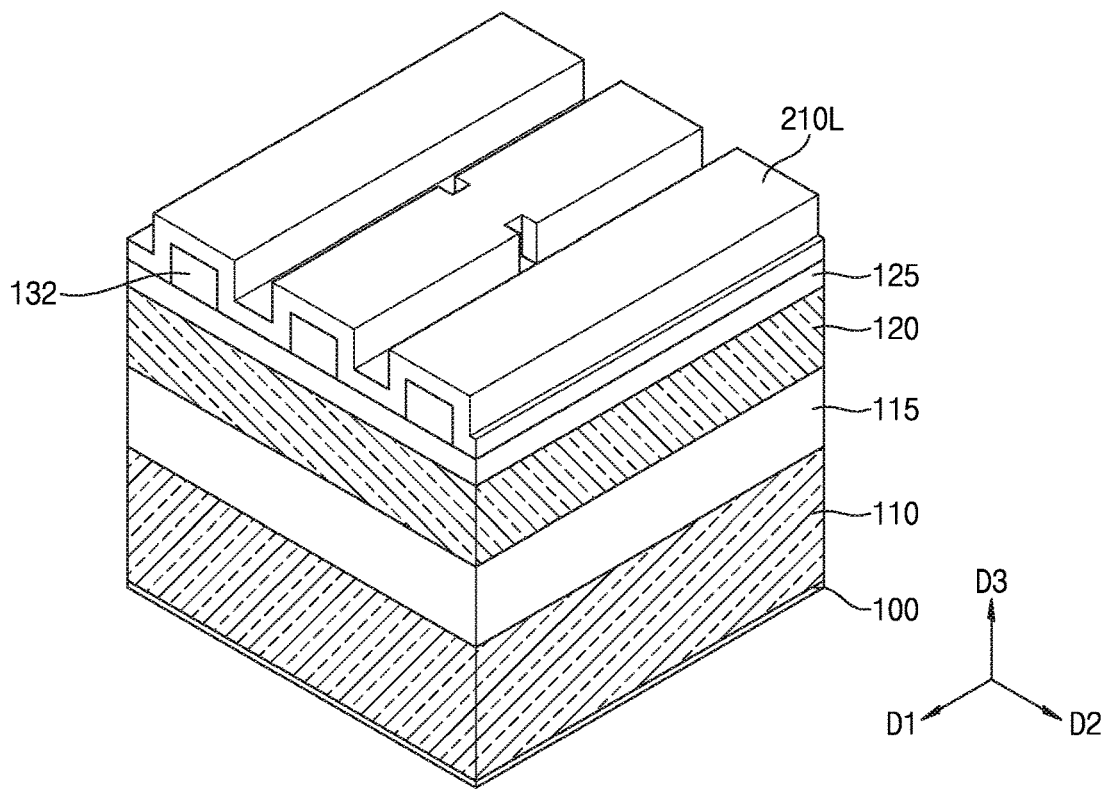
Figure 22:
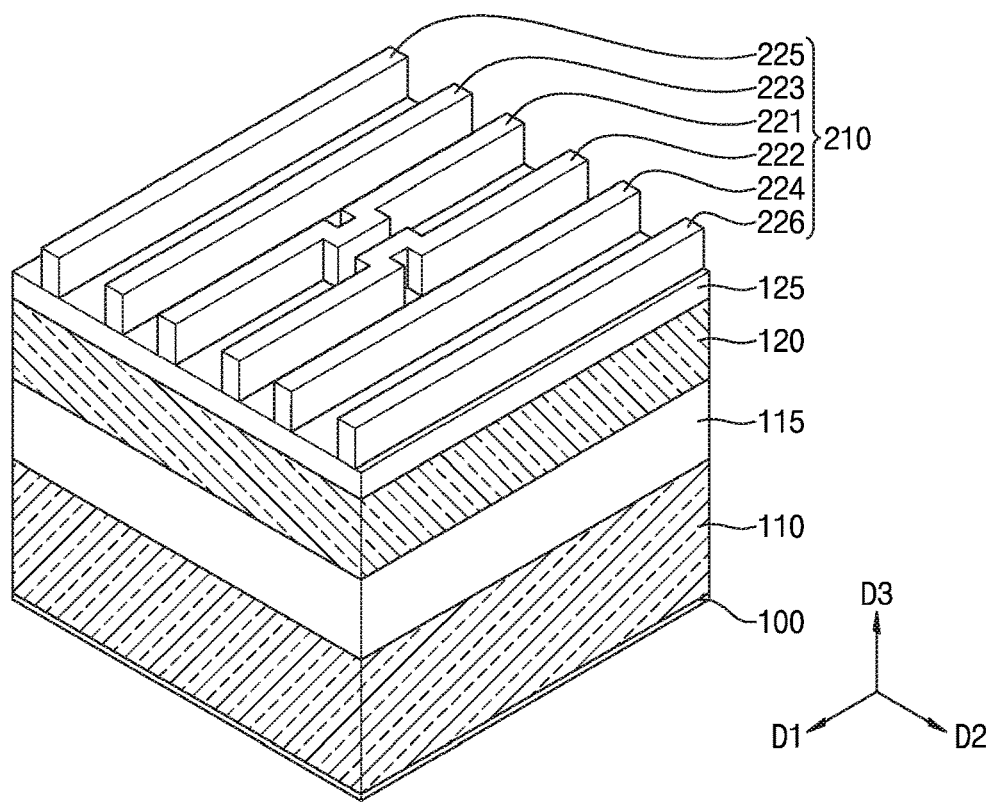

FIGS. 20 to 22 are drawings for describing a method of manufacturing a semiconductor device according to an example embodiment of the present inventive concept. In FIGS. 9 to 22, the same reference numerals denote the same components. Hereinafter, the contents substantially the same as those described in FIGS. 1A to 19 will be omitted for the simplicity of description.

Referring to FIG. 20, a photoresist pattern 310 may be disposed on a mandrel layer 130. The photoresist pattern 310 may include a first line pattern J1, a second line pattern J2, and a third line pattern J3 that extend in the first direction D1. The first to third line patterns J1, J2, and J3 may be spaced apart from each other at predetermined intervals in the second direction D2. In the example embodiment, the first line pattern J1 may include notches NC recessed concavely toward the inside of the first line pattern J1 from both sidewalls of the first line pattern J1. For example, each of the notches NC may have a rectangular shape as illustrated in FIG. 20. Alternatively, the notches NC may have a V-shape.

Referring to FIG. 21, a mandrel pattern 132 may be formed through an etching process using the photoresist pattern 310 as an etch mask. The mandrel pattern 132 may have a planar shape corresponding to that of the photoresist pattern 310. For example, a notch may also be formed in the mandrel pattern 132. A spacer layer 210L may conformally cover the mandrel pattern 132.

Referring to FIG. 22, a portion of the spacer layer 210L may be removed, and mandrel spacers 210 positioned on both sidewalls of the mandrel pattern 132 may be formed. The mandrel spacers 210 are formed, and the mandrel pattern 132 may be removed. The mandrel spacers 210 may include first to sixth mandrel spacers 221, 222, 223, 224, 225, and 226 extending in the first direction D1 and spaced apart from each other in the second direction D2. A protrusion and a recess may be formed on each of the first mandrel spacer 221 and the second mandrel spacer 222. For example, the shape of a sidewall of the protrusion may correspond to the shape of the notch formed in the mandrel pattern 132. Subsequently, hard mask patterns and gate patterns corresponding to planar shapes of the mandrel spacers 210 may be formed through the same or similar process as the etching process performed in the example embodiment of FIGS. 14 to 16. The gate patterns as illustrated in FIGS. 3A and/or 3B may be formed.

Figure 23:
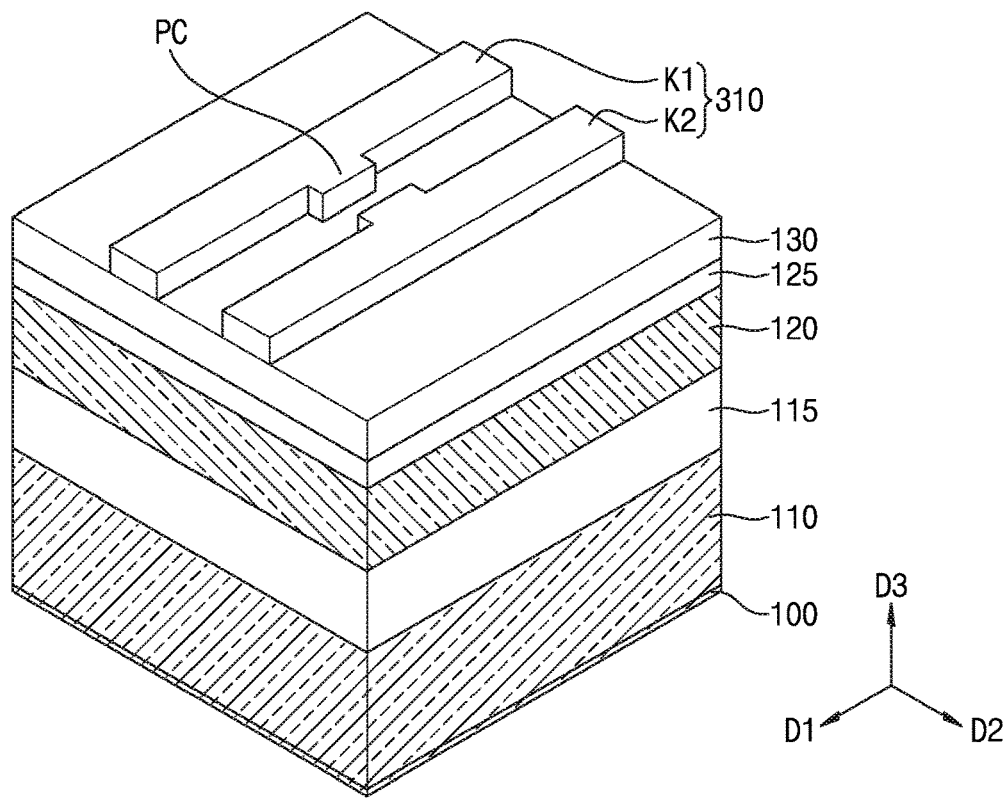
FIGS. 23 to 25 are drawings for describing a method of manufacturing a semiconductor device according to an example embodiment of the present inventive concept.
Figure 24:
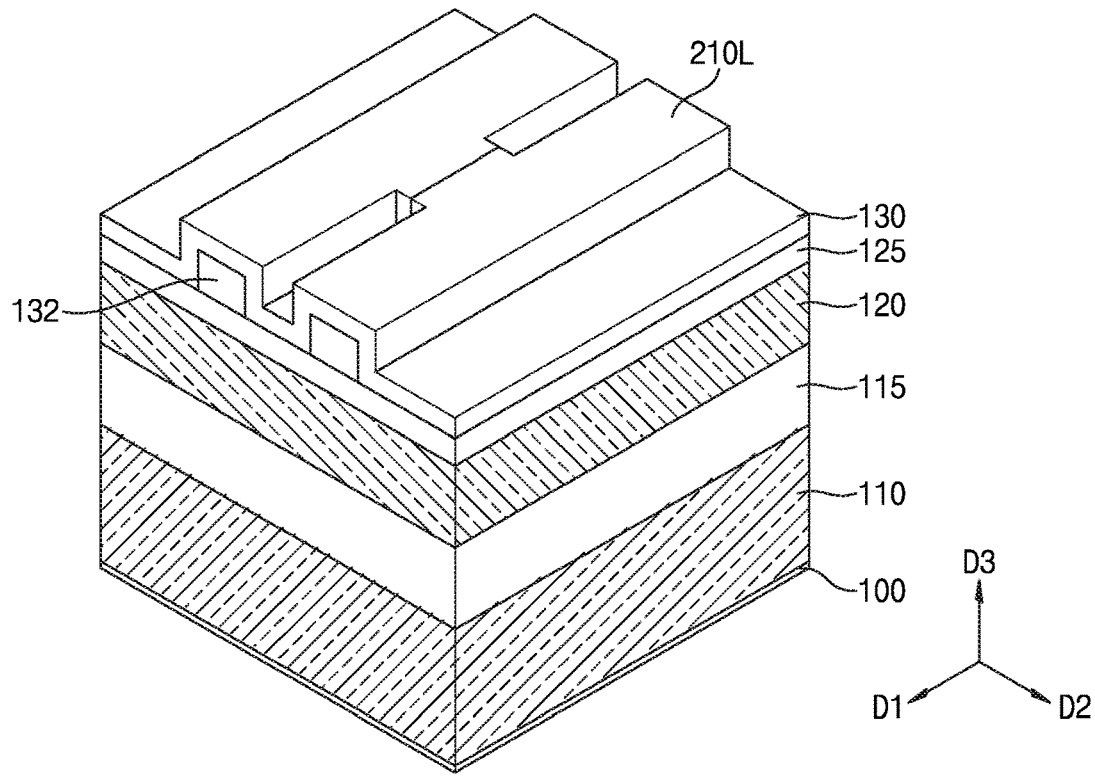
Figure 25:
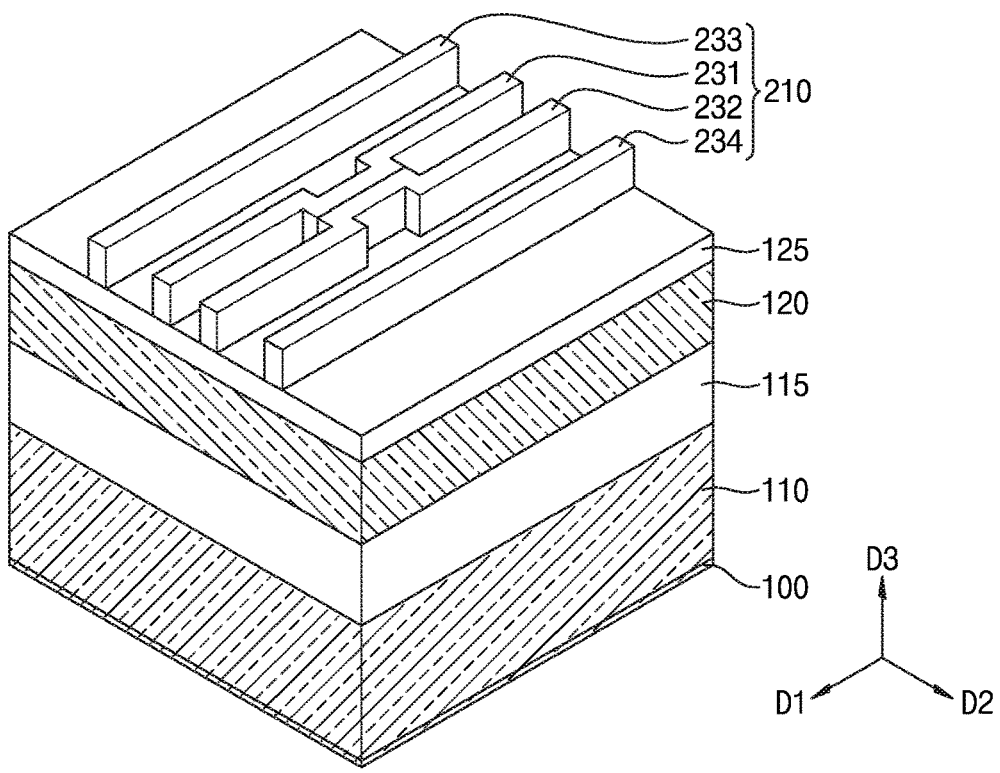
Figure 26:
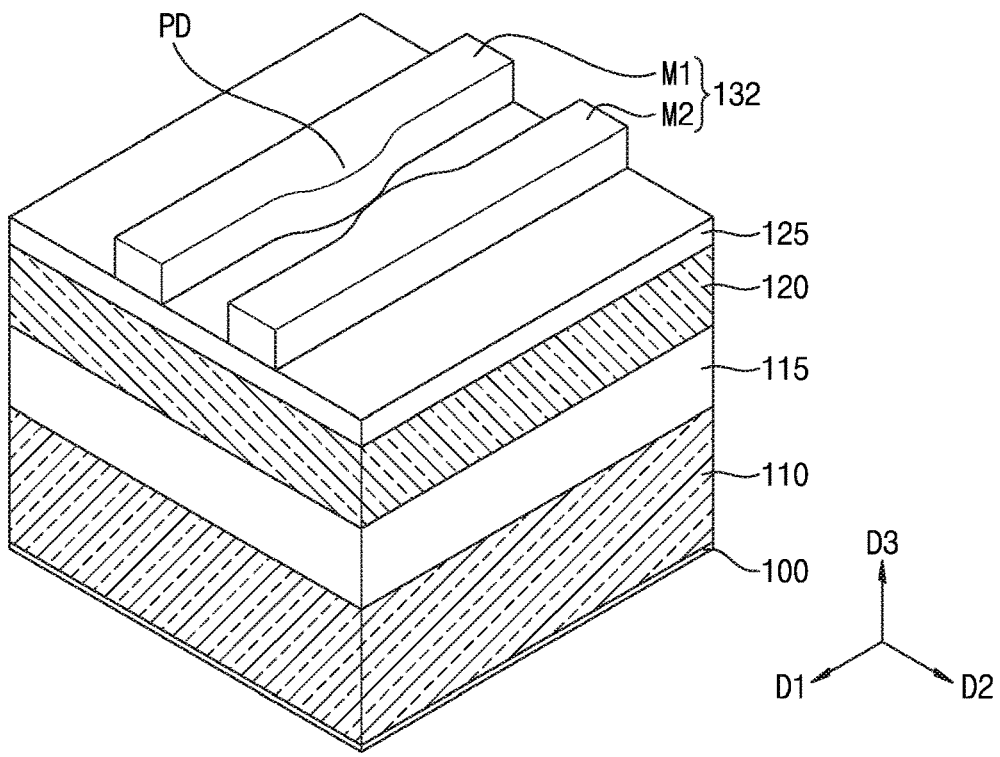
FIGS. 26 and 27 are drawings for describing a method of manufacturing a semiconductor device according to an example embodiment of the present inventive concept.
Figure 27:
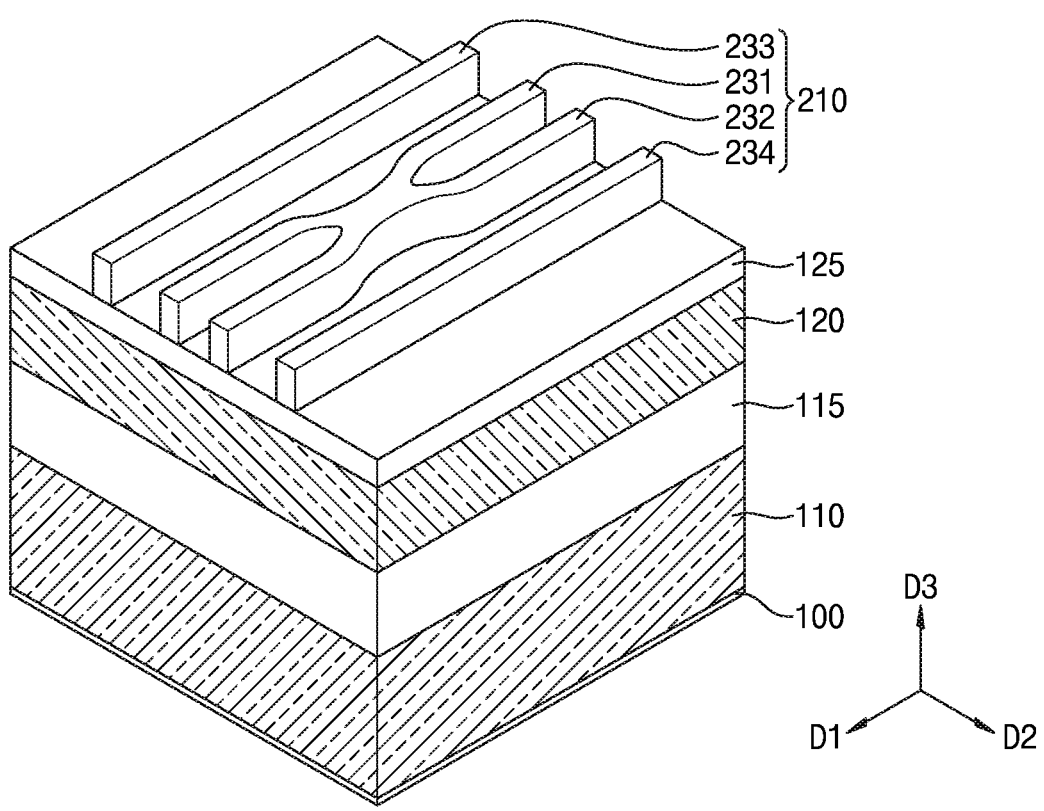

FIGS. 23 to 25 are drawings for describing a method of manufacturing a semiconductor device according to an example embodiment of the present inventive concept. FIGS. 26 and 27 are drawings for describing a method of manufacturing a semiconductor device according to an example embodiment of the present inventive concept. In FIGS. 7 to 27, the same reference numerals denote the same components. Hereinafter, the contents substantially the same as those described in FIGS. 1A to 22 will be omitted for the simplicity of description.

Referring to FIG. 23, a photoresist pattern 310 including a first line pattern K1 and a second line pattern K2, which extend in the first direction D1, may be formed on a mandrel layer 130. A protrusion PC may be formed on an inner sidewall of each of the first line pattern K1 and the second line pattern K2. For example, the protrusions PC may have a triangular or quadrangular shape.

Referring to FIGS. 24 and 25, a mandrel pattern 132 may be formed using the photoresist pattern 310. The mandrel pattern 132 may be conformally covered by a spacer layer 210L. A thickness of the spacer layer 210L may correspond to or be greater than half of a separation distance between the protrusion PC of the first line pattern K1 and the protrusion PC of the second line pattern K2 in the second direction D2. A space between the protrusion PC of the first line pattern K1 and the protrusion PC of the second line pattern K2 may be substantially completely filled by the spacer layer 210L.

A portion of the spacer layer 210L may be removed, and mandrel spacers 210 may be formed. The mandrel spacers 210 may include first to fourth mandrel spacers 231, 232, 233, and 234. The first mandrel spacer 231 and the second mandrel spacer 232 may be in contact with each other. The mandrel pattern 132 may be removed. Subsequently, hard mask patterns and gate patterns corresponding to planar shapes of the mandrel spacers 210 may be formed through the same or similar process as the etching process performed in the example embodiment of FIGS. 14 to 16. The gate patterns as illustrated in FIGS. 4A and/or 4B may be formed.

Referring to FIGS. 26 and 27, in the example embodiment, protrusions PD of mandrel patterns M1 and M2 formed through a process using the photoresist patterns 310 (K1 and K2), except that each of the protrusions PC may be a curved surface with rounded side surfaces. Subsequently, mandrel spacers 210 may be formed through a process using the mandrel pattern 132, and the gate patterns as illustrated in FIGS. 5A and 5B may be formed through a process similar to the etching process performed in the example embodiment of FIGS. 14 to 16.

According to the example embodiments of the present inventive concept, when dummy gate patterns are formed with a fine pitch, a leaning phenomenon that may occur in the dummy gate patterns can be prevented through support parts supporting the dummy gate patterns.

While the embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:

1. A semiconductor device comprising:
a dummy gate structure including a first gate pattern in which first dummy gate lines extending in a first direction are connected to each other on a substrate, and a second gate pattern in which second dummy gate lines extending in the first direction are connected to each other, the second dummy gate lines being aligned with the first dummy gate lines; and
a third gate pattern extending in the first direction in parallel with the dummy gate structure on a first side of the dummy gate structure.

2. The semiconductor device of claim 1,
wherein the first gate pattern comprises:
a first dummy gate line extending in the first direction;
a second dummy gate line disposed in parallel with the first dummy gate line; and
a first bridge pattern connecting one end of the first dummy gate line to one end of the second dummy gate line; and
wherein the second gate pattern comprises:
a third dummy gate line extending on the same line as the first dummy gate line;
a fourth dummy gate line extending on the same line as the second dummy gate line, and disposed adjacent to the third dummy gate line; and
a second bridge pattern connecting one end of the third dummy gate line to one end of the fourth dummy gate line.

3. The semiconductor device of claim 2, further comprising:
a fourth gate pattern extending in the first direction in parallel with the dummy gate structure at a second side of the dummy gate structure,
wherein at least one of the third gate pattern and the fourth gate pattern is a real gate line.

4. The semiconductor device of claim 2,
wherein the first bridge pattern has a U-shape, and
wherein the second bridge pattern has an inverted U-shape and is symmetrical to the first bridge pattern.

5. The semiconductor device of claim 4,
wherein in the first bridge pattern, a portion nearer the second bridge pattern has a greater width than a portion farther from the second bridge pattern, and
wherein in the second bridge pattern, a portion nearer the first bridge pattern has a greater width than a portion farther from the first bridge pattern.

6. The semiconductor device of claim 2, further comprising:
a third bridge pattern disposed between the first bridge pattern and the second bridge pattern and connecting the first bridge pattern to the second bridge pattern,
wherein a width of the third bridge pattern is smaller than a width of the first bridge pattern.

7. The semiconductor device of claim 6, wherein the first, second, and third bridge patterns are connected to each other to have an X-shape.

8. A semiconductor device comprising:
a cell region including active fins extending in a first direction and real gate lines extending in a second direction, which intersects the first direction, and crossing the active fins; and
a dummy region on which dummy gate structures extending in parallel with the real gate lines are disposed, wherein the dummy gate structures include:
- a pair of upper dummy gate lines extending in the second direction and disposed in parallel with each other;
- an upper bridge pattern connecting the pair of upper dummy gate lines to each other;
- a pair of lower dummy gate lines disposed to be spaced apart from the pair of upper dummy gate lines and the upper bridge pattern in the second direction; and
- a lower bridge pattern connecting the pair of lower dummy gate lines to each other.

9. The semiconductor device of claim 8, wherein a portion of the dummy gate structures overlap the cell region and the dummy region.

10. The semiconductor device of claim 8,
wherein the pair of upper dummy gate lines comprises:
- a first dummy gate line disposed on the cell region; and
- a second dummy gate line disposed on the dummy region, and wherein the upper bridge pattern is disposed over the cell region and the dummy region.

11. The semiconductor device of claim 10, wherein the first dummy gate line crosses the active fins, and the second dummy gate line is disposed adjacent to ends of the active fins.

12. The semiconductor device of claim 10, wherein the upper bridge pattern overlaps the active fins.

13. The semiconductor device of claim 8,
wherein the cell region comprises:
- a first cell region on which first active fins are disposed;
- a second cell region on which second active fins are disposed; and
- a middle region disposed between the first cell region and the second cell region, and wherein the pair of upper dummy gate lines are disposed on the first cell region, and the pair of lower dummy gate lines are disposed on the second cell region.

14. The semiconductor device of claim 13, wherein the upper bridge pattern and the lower bridge pattern are disposed on the middle region.

15. The semiconductor device of claim 14, wherein the upper bridge pattern is disposed on the first cell region, the pair of lower dummy gate lines extend to the first cell region, and the lower bridge pattern is disposed on the first cell region.

16. The semiconductor device of claim 8, wherein the upper bridge pattern and the lower bridge pattern are connected to each other.

17. The semiconductor device of claim 8, wherein the dummy region does not comprise the active fins, and the semiconductor device further comprises a dummy gate structure disposed on the cell region.

18. A semiconductor device comprising:
- a first gate pattern extending in a first direction on a substrate; and
- a second gate pattern disposed adjacent to the first gate pattern in the first direction,
- wherein the first gate pattern comprises a first protrusion in which an inner sidewall of the first gate pattern, which is adjacent to the second gate pattern, protrudes toward the second gate pattern, and
- wherein the second gate pattern comprises a second protrusion in which an inner sidewall of the second gate pattern, which is adjacent to the first gate pattern, protrudes toward the first protrusion.

19. The semiconductor device of claim 18,
wherein the first gate pattern further comprises a first recess in which an outer sidewall is recessed concavely toward the first protrusion, and
wherein the second gate pattern further comprises a second recess in which an outer sidewall is concavely recessed toward the second protrusion.

20. The semiconductor device of claim 19, wherein the first protrusion and the second protrusion are in contact with each other.

* * * * *